US011195851B2

(12) United States Patent
Kim et al.

(10) Patent No.: US 11,195,851 B2
(45) Date of Patent: Dec. 7, 2021

(54) SEMICONDUCTOR MEMORY DEVICE

(71) Applicant: SK hynix Inc., Icheon-si (KR)

(72) Inventors: Jae Taek Kim, Seoul (KR); Young Ock Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 29 days.

(21) Appl. No.: 16/670,598

(22) Filed: Oct. 31, 2019

(65) Prior Publication Data

US 2020/0381447 A1    Dec. 3, 2020

(30) Foreign Application Priority Data

May 31, 2019   (KR) .......................... 10-2019-0064474

(51) Int. Cl.
| | |
|---|---|
| *H01L 27/115* | (2017.01) |
| *H01L 23/522* | (2006.01) |
| *H01L 27/11582* | (2017.01) |
| *H01L 23/528* | (2006.01) |
| *H01L 27/11573* | (2017.01) |

(52) U.S. Cl.
CPC ...... *H01L 27/11582* (2013.01); *H01L 23/528* (2013.01); *H01L 23/5226* (2013.01); *H01L 27/11573* (2013.01)

(58) Field of Classification Search
CPC ... H01L 23/52; H01L 23/522; H01L 23/5226; H01L 23/528; H01L 27/11; H01L 27/115; H01L 27/11573; H01L 27/11582
USPC .......................................................... 257/324
See application file for complete search history.

(56) References Cited

U.S. PATENT DOCUMENTS

| | | | |
|---|---|---|---|
| 2017/0213843 A1* | 7/2017 | Choi | ........................ H01L 28/00 |
| 2017/0338241 A1* | 11/2017 | Lee | .................. H01L 27/11582 |
| 2017/0358593 A1 | 12/2017 | Yu et al. | |

FOREIGN PATENT DOCUMENTS

KR    1020180122847 A    11/2018

* cited by examiner

*Primary Examiner* — Fazli Erdem
(74) *Attorney, Agent, or Firm* — William Park & Associates Ltd.

(57) ABSTRACT

The present technology provides a semiconductor memory device. The semiconductor memory device includes a source film spaced from a substrate and disposed on the substrate, a conductive contact plug penetrating the source film, and a dummy stack body including dummy interlayer insulating films and sacrificial insulating films alternately stacked on the conductive contact plug.

17 Claims, 22 Drawing Sheets

FIG. 4C
FIG. 5
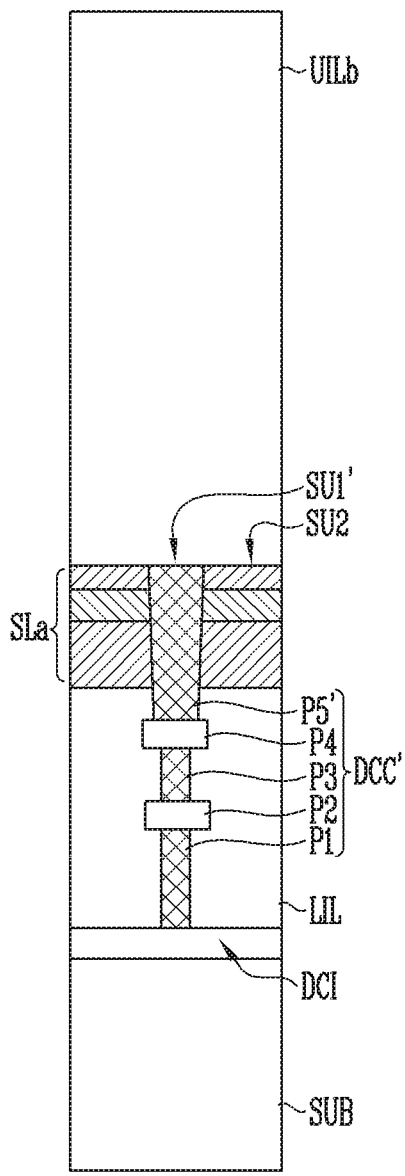
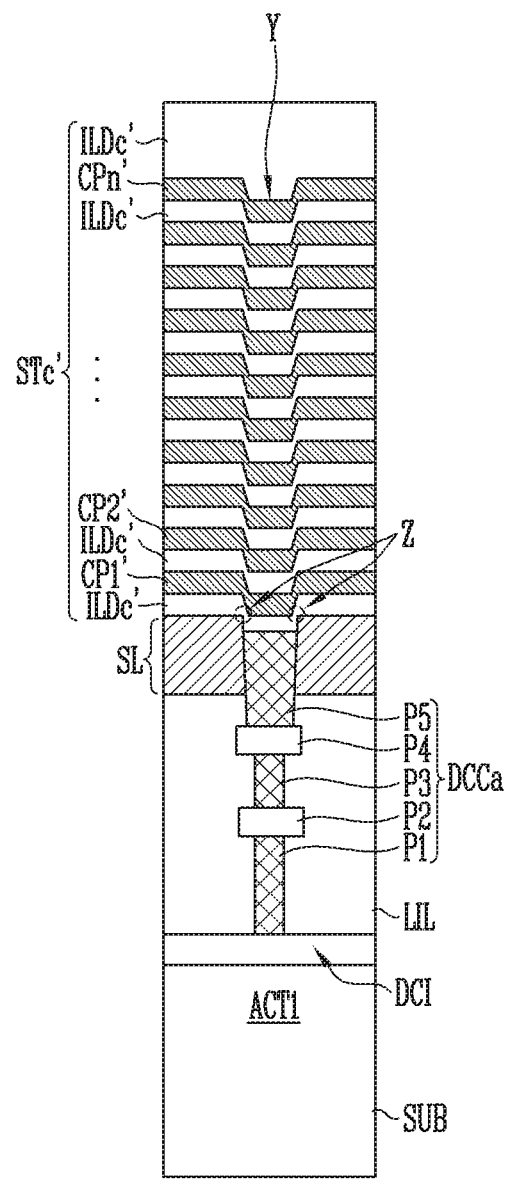

SEMICONDUCTOR MEMORY DEVICE

CROSS-REFERENCE TO RELATED APPLICATION

The present application claims priority under 35 U.S.C. § 119(a) to Korean patent application number 10-2019-0064474, filed on May 31, 2019, in the Korean Intellectual Property Office, the entire disclosure of which is incorporated herein by reference.

BACKGROUND

1. Technical Field

The present disclosure relates to a semiconductor memory device, and more particularly, to a three-dimensional semiconductor memory device.

2. Related Art

A semiconductor memory device includes memory cells capable of storing data. In order to improve integration of the memory cells, a three-dimensional semiconductor memory device has been proposed.

The three-dimensional semiconductor memory device includes memory cells that are three-dimensionally arranged. The three-dimensional semiconductor memory device may include a channel structure passing through conductive patterns stacked on a substrate.

SUMMARY

A semiconductor memory device according to an embodiment of the present disclosure may include a source film spaced from a substrate and disposed on the substrate, a conductive contact plug penetrating the source film, and a dummy stack body including dummy interlayer insulating films and sacrificial insulating films alternately stacked on the conductive contact plug.

A semiconductor memory device according to an embodiment of the present disclosure may include a source film spaced from a substrate and disposed on the substrate, a conductive contact plug penetrating the source film to contact the substrate, a cell stack body including cell interlayer insulating films and conductive patterns alternately stacked on the source film, and laterally spaced apart from the conductive contact plug, and an upper insulating structure covering the conductive contact plug and the cell stack body.

BRIEF DESCRIPTION OF THE DRAWINGS

FIGS. 4A to 4C are cross-sectional views illustrating conductive contact plugs according to embodiments of the present disclosure.

FIG. 5 is a cross-sectional view illustrating a short circuit between the conductive contact plug and a cell stack body.

DETAILED DESCRIPTION

Figure 1:
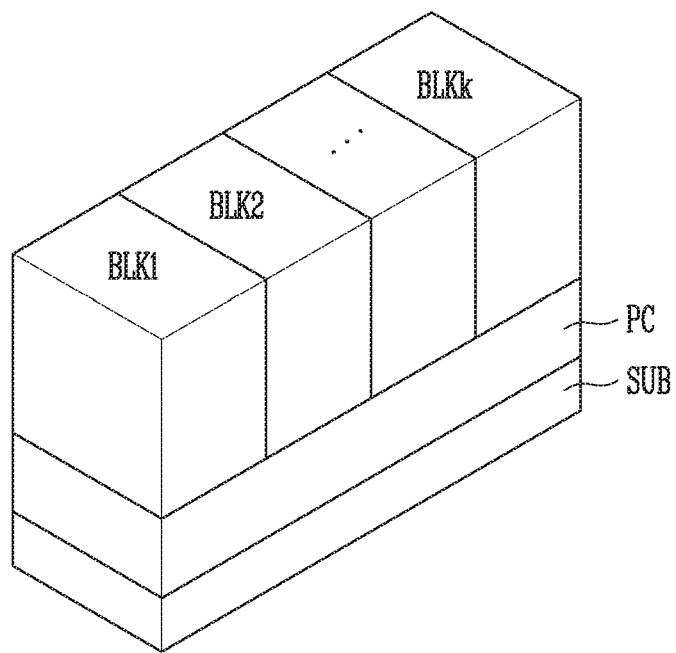
FIG. 1 is a block diagram schematically illustrating a semiconductor memory device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Examples of embodiments will be described in greater detail with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

Embodiments of the present disclosure may provide a semiconductor memory device capable of improving operation reliability.

FIG. 1 is a block diagram schematically illustrating a semiconductor memory device according to an embodiment of the present disclosure.

Referring to FIG. 1, the semiconductor memory device may include a peripheral circuit structure PC and memory blocks BLK1 to BLKk (k is a natural number equal to or greater than 2) disposed on a substrate SUB. The memory blocks BLK1 to BLKk may overlap the peripheral circuit structure PC.

The substrate SUB may be a single crystal semiconductor film. For example, the substrate SUB may be a bulk silicon substrate, a silicon on insulator substrate, a germanium substrate, a germanium on insulator substrate, a silicon-germanium substrate, or an epitaxial film formed through a selective epitaxial growth method.

The peripheral circuit structure PC may include a row decoder, a column decoder, a page buffer, a control circuit, and the like which configure a circuit for controlling an operation of the memory blocks BLK1 to BLKk. For example, the peripheral circuit structure PC may include an NMOS transistor, a PMOS transistor, a resistor, and a capacitor which are electrically connected to the memory blocks BLK1 to BLKk. The peripheral circuit structure PC may be disposed between the substrate SUB and the memory blocks BLK1 to BLKk. However, the present disclosure does not exclude an embodiment in which the peripheral circuit structure PC extends to another region of the substrate SUB that is not overlapped with the memory blocks BLK1 to BLKk.

Each of the memory blocks BLK1 to BLKk may include impurity doped regions, bit lines, cell strings electrically connected to the impurity doped regions and bit lines, word lines electrically connected to the cell strings, and select lines electrically connected to the cells strings. Each of the cell strings may include memory cells and select transistors connected in series by a channel structure. Each of the select lines is used as a gate electrode of a select transistor corresponding to the select line, and each of the word lines is used as a gate electrode of a memory cell corresponding to the word line.

Figure 2A:
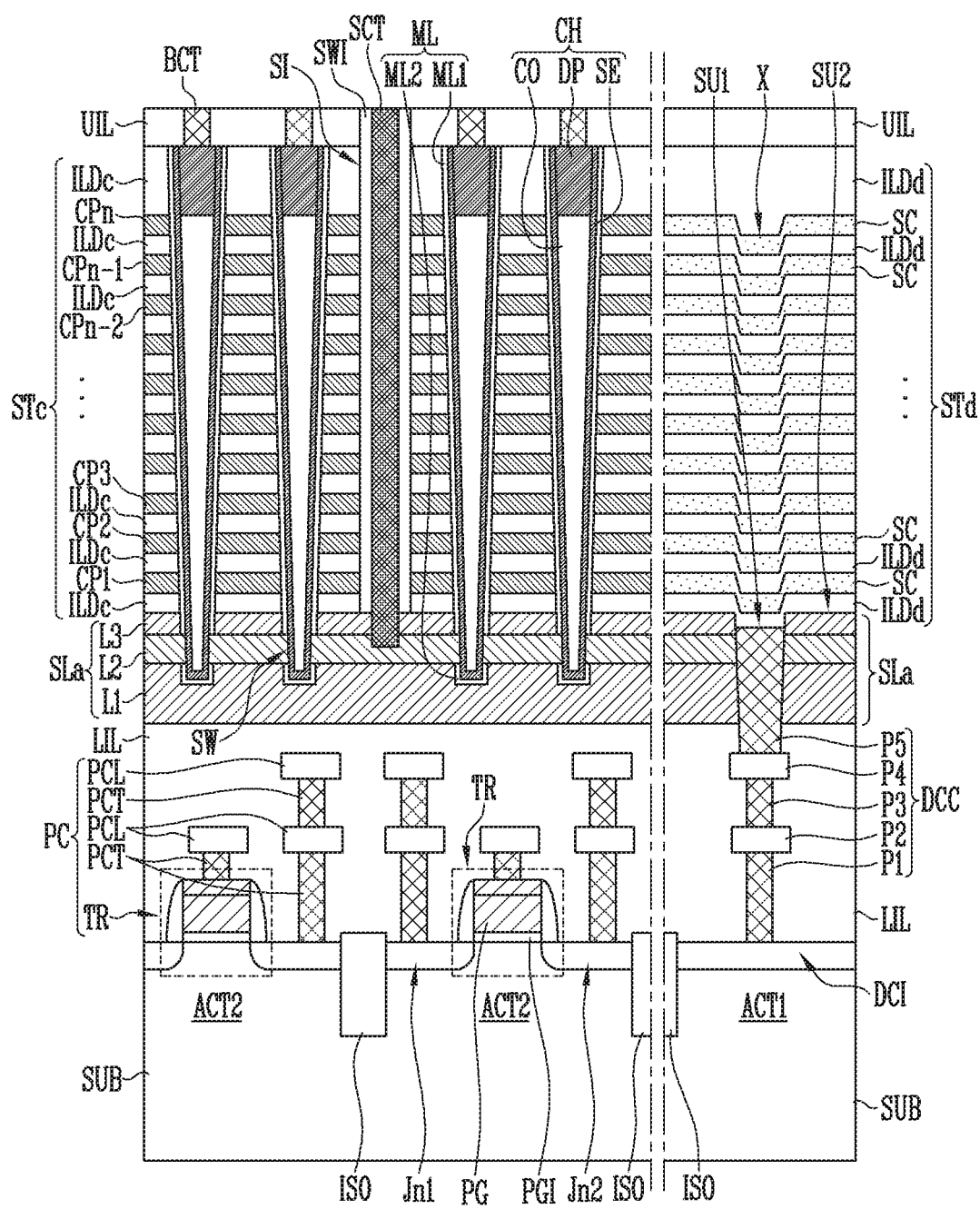
FIGS. 2A to 2C are cross-sectional views illustrating semiconductor memory devices according to embodiments of the present disclosure.
Figure 2B:
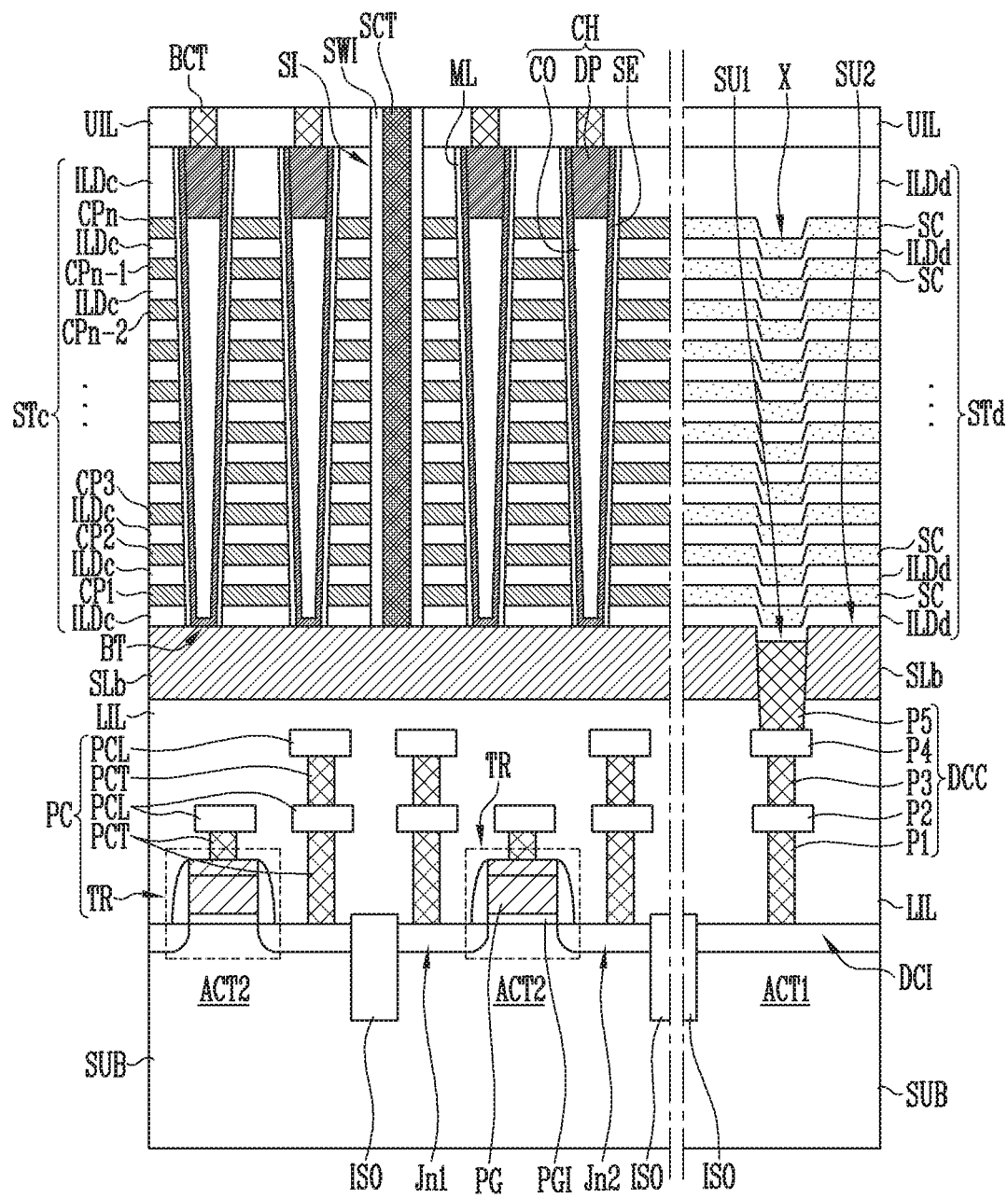
Figure 2C:
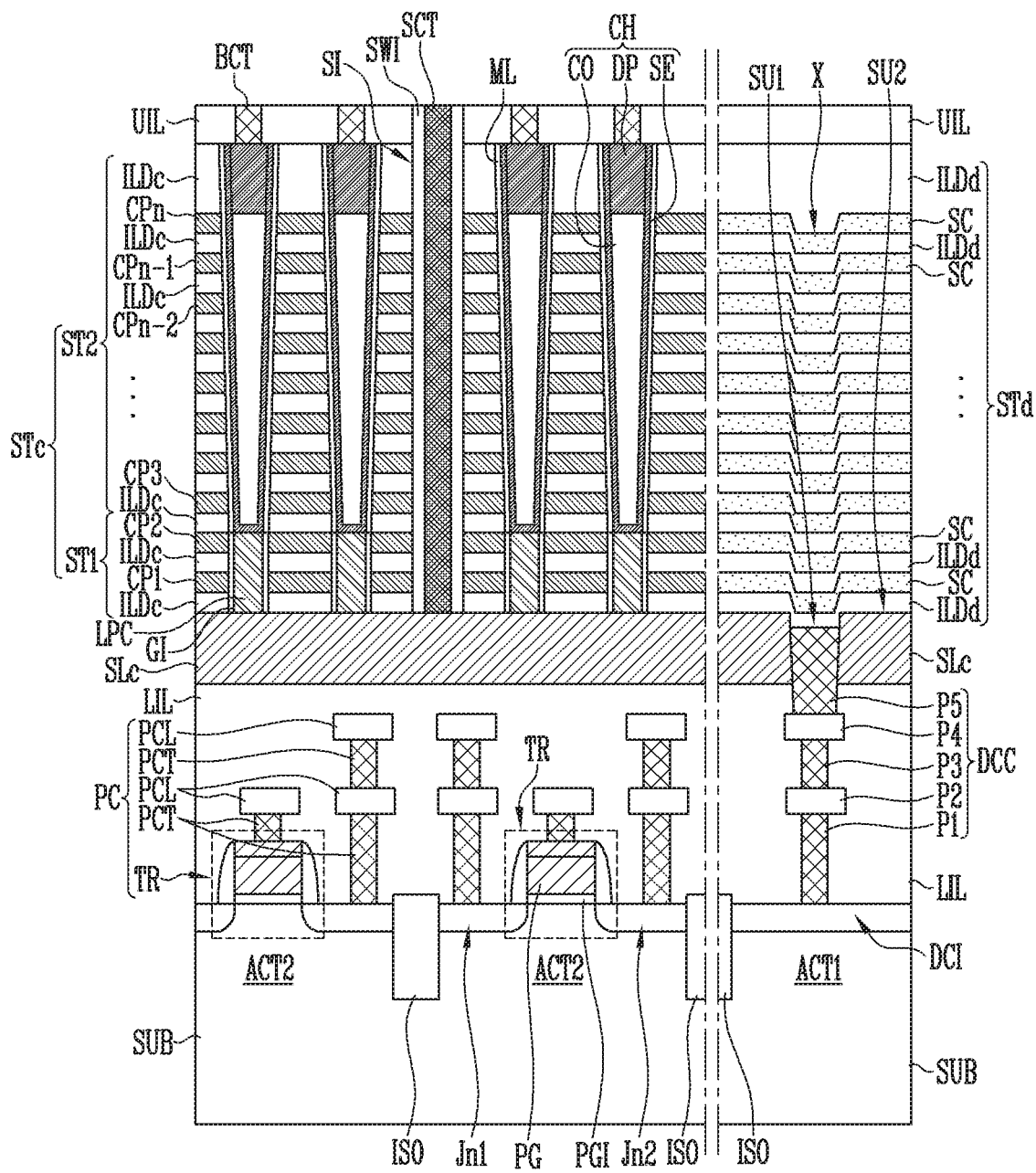

FIGS. 2A to 2C are cross-sectional views illustrating semiconductor memory devices according to embodiments of the present disclosure.

Referring to FIGS. 2A to 2C, each of the semiconductor memory devices may include a source film SLa, SLb, or SLc disposed on a substrate SUB, a cell stack body Stc disposed on the source film SLa, SLb, or SLc, a dummy stack body STd disposed on the source film SLa, SLb, or SLc and a conductive contact plug DCC penetrating a portion of the source film SLa, SLb, or SLc overlapped with the dummy stack body STd.

The substrate SUB may be formed of the same material as the substrate SUB described above with reference to FIG. 1. Conductive dopants defining a well region may be injected into the substrate SUB. The conductive dopant defining the well region may be an n-type or p-type impurity. The well region of the substrate SUB may be divided into active regions ACT1 and ACT2 divided by isolation layers ISO. The isolation layers ISO may include an insulating material buried in the substrate SUB. The active regions ACT1 and ACT2 may include a first active region ACT1 overlapped with the conductive contact plug DCC and one or more second active regions ACT2 overlapped by the cell stack body STc.

The source film SLa, SLb, or SLc may be disposed apart from the substrate SUB by the peripheral circuit structure PC and a lower insulating structure LIL.

The peripheral circuit structure PC may include a transistor TR as described above with reference to FIG. 1. The transistor TR may include a peripheral-gate insulating film PGI disposed on the second active region ACT2, a peripheral-gate electrode PG disposed on the peripheral-gate insulating film PGI, and first and second junctions Jn1 and Jn2 disposed in the second active region ACT2 on both sides of the peripheral-gate gate electrode PG. The first and second junctions Jn1 and Jn2 are regions defined by injecting an n-type or p-type impurity into the second active region ACT2, and one of the first and second junctions Jn1 and Jn2 may be used as a source junction and the other may be used as a drain junction.

The peripheral circuit structure PC may include connection wires PCL and peripheral-contact plugs PCT connected to the transistor TR. The peripheral circuit structure PC may include the resistor, the capacitor, and the like, as described with reference to FIG. 1, in addition to the transistor TR, and the connection wires PCL and the peripheral-contact plugs PCT are connected to the transistor TR.

A conductive impurity may be injected into the first active region ACT1. As an embodiment, a discharge impurity region DCI may be defined in the first active region ACT1. The discharge impurity region DCI may include conductive impurities forming a PN diode. The discharge impurity region DCI may be used as a path for discharging a charge accumulated in the source film SLa, SLb, or SLc.

The above-described peripheral circuit structure PC may be covered with the lower insulating structure LIL disposed between the source film SLa, SLb, or SLc and the substrate SUB. The lower insulating structure LIL may extend to cover the discharge impurity region DCI. The lower insulation structure LIL may include insulating films stacked in multiple layers.

The source film SLa, SLb, or SLc may be disposed on the lower insulating structure LIL. The source film SLa, SLb, or SLc may include two or more semiconductor films L1, L2, and L3 as shown in FIG. 2A, or may include a single semiconductor film as shown in FIGS. 2B and 2C.

Referring to FIG. 2A, the source film SLa may include first to third semiconductor films L1 to L3 sequentially stacked on the lower insulating structure LIL. Each of the first and second semiconductor films L1 and L2 may be a doped semiconductor film including a source dopant. As an embodiment, each of the first and second semiconductor films L1 and L2 may include a doped silicon film including an n-type impurity. The third semiconductor film L3 may be omitted in some cases. The third semiconductor film L3 may include at least one of an n-type doped silicon film and an un-doped silicon film.

Referring to FIGS. 2B and 2C, the source film SLb or SLc may be a doped semiconductor film including a source dopant. As an embodiment, the source film SLb or SLc may be a doped silicon film including an n-type impurity.

Referring to FIGS. 2A to 2C, the source film SLa, SLb, or SLc is penetrated by the conductive contact plug DCC. The conductive contact plug DCC may penetrate the lower insulating structure LIL to be in contact with the discharge impurity region DCI of the substrate SUB. The conductive contact plug DCC may be in direct contact with the discharge impurity region DCI and the source film SLa, SLb, or SLc. The source film SLa, SLb, or SLc and the discharge impurity region DCI may be connected to each other by the conductive contact plug DCC. Therefore, the charge accumulated in the source film SLa, SLb, or SLc may be discharged to the substrate SUB through the discharge impurity region DCI via the conductive contact plug DCC.

The conductive contact plug DCC may include a first upper surface SU1 facing the dummy stack body STd and the source film SLa, SLb, or SLc may include a second upper surface SU2 facing the dummy stack body STd. A dishing phenomenon may occur in a process of forming the conductive contact plug DCC. In this case, the first upper surface SU1 may be formed lower than the second upper surface SU2.

The conductive contact plug DCC may include first to fifth patterns P1 to P5 that are sequentially stacked. The first pattern P1 and the third pattern P3 may be disposed in the lower insulation structure LIL and may be disposed at levels where the peripheral-contact plugs PCT are disposed. The second pattern P2 and the fourth pattern P4 may be disposed in the lower insulating structure LIL and may be disposed at levels where the connection wires PCL are disposed. The fifth pattern P5 may penetrate the source film SLa, SLb, or SLc and may extend into the lower insulating structure LIL to be in contact with the fourth pattern P4.

The dummy stack body STd may be overlapped with the conductive contact plug DCC. The dummy stack body STd may extend to cover the first region of the source film SLa, SLb, or SLc overlapped with the discharge impurity region DCI and the conductive contact plug DCC. The dummy stack body STd may include dummy interlayer insulating films ILDd and sacrificial insulating films SC that are alternately stacked on the first region of the source film SLa, SLb, or SLc and the conductive contact plug DCC. At least one of the dummy interlayer insulating films ILDd and at least one of the sacrificial insulating films SC may include a depression X. The depression X may be formed by a step difference defined by a height difference between the first upper surface SU1 of the conductive contact plug DCC and the second upper surface SU2 of the source film SLa, SLb, or SLc, and may be overlapped with the conductive contact plug DCC. Because the dummy interlayer insulating films ILDd and the sacrificial insulating films SC are formed of an insulating material, even though a gap between the lowermost sacrificial insulating film among the sacrificial insulating films SC and the conductive contact plug DCC is close to the depression X, an electrical characteristic of the semiconductor memory device are not affected.

The cell stack body STc may include cell interlayer insulating films ILDc and conductive patterns CP1 to CPn (n is a natural number equal to or greater than 2) that are alternately stacked on a second region of the source film SLa, SLb, or SLc. The cell stack body STc may be disposed not to overlap the conductive contact plug DCC. The cell stack body STc may be disposed at the same level as the dummy stack body STd. The cell interlayer insulating films ILDc may be disposed at the same level as the dummy interlayer insulating films ILDd and the conductive patterns CP1 to CPn may be disposed at the same level as the sacrificial insulating films SC.

The cell interlayer insulating films ILDc and the dummy interlayer insulating films ILDd may be formed of the same material and may be formed through the same process. The sacrificial insulating films SC may be formed of a material having an etch rate different from that of the cell interlayer insulating films ILDc and the dummy interlayer insulating films ILDd. For example, the cell interlayer insulating films ILDc and the dummy interlayer insulating films ILDd may include silicon oxide, and the sacrificial insulating films SC may include silicon nitride.

Each of the conductive patterns CP1 to CPn may include various conductive materials such as a doped silicon film, a metal film, a metal silicide film, and a barrier film, and may include two or more kinds of conductive materials. For example, each of the conductive patterns CP1 to CPn may include tungsten and a titanium nitride film (TiN) surrounding a surface of tungsten. The tungsten is a low resistance metal, and may reduce a resistance of the conductive patterns CP1 to CPn. The titanium nitride film (TiN) is a barrier film and may prevent direct contact between the tungsten and the cell interlayer insulating films ILDc.

The conductive patterns CP1 to CPn may be used as gate electrodes of the cell strings. The gate electrodes of the cell string may include source select lines, word lines, and drain select lines. The source select lines are used as gate electrodes of the source select transistors, drain select lines are used as gate electrodes of the drain select transistors, and word lines are used as gate electrodes of the memory cells.

The cell stack body STc may surround the channel structure CH. That is, the channel structure CH may penetrate the cell stack body STc. The channel structure CH may include a channel semiconductor pattern SE. The channel semiconductor pattern SE may include a silicon film. A center region of the channel semiconductor pattern SE may be filled with a core insulating film CO. The core insulating film CO may be formed at a height lower than that of the channel semiconductor pattern SE. An upper center region of the channel semiconductor pattern SE extending over the core insulating film CO may be filled with a doped semiconductor pattern DP disposed on the core insulating film CO. The doped semiconductor pattern DP may include an n-type doped silicon film. The channel semiconductor pattern SE of the channel structure CH may be used as a channel region of the cell string, and the doped semiconductor pattern DP of the channel structure CH may be used as the drain junction of the cell string. The side wall of the channel structure CH may be surrounded by a memory film ML. The channel structure CH may be connected to the source film SLa, SLb, or SLc in various methods.

Referring to FIG. 2A, the channel structure CH may penetrate the cell stack body STc and extend into the source film SLa. The side wall of the channel structure CH facing the source film SLa may be in direct contact with the source film SLa. As an embodiment, the second semiconductor film L2 of the source film SLa may be in direct contact with the side wall of the channel semiconductor pattern SE facing the second semiconductor film L2. In this case, the memory film ML may be divided into a first memory pattern ML1 and a second memory pattern ML2 by the second semiconductor film L2. The first memory pattern ML1 may be disposed between the channel structure CH and the cell stack body STc and may extend between the channel structure CH and the third semiconductor film L3. The second memory pattern ML2 may be disposed between the channel structure CH and the first semiconductor film L1.

Referring to FIG. 2B, the channel structure CH may penetrate the cell stack body STc and include a bottom surface that is in direct contact with the source film SLb. The channel semiconductor pattern SE of the channel structure CH may extend along the bottom surface of the channel structure CH to be in direct contact with the source film SLb. In this case, the memory film ML may be penetrated by the channel semiconductor pattern SE, and may be disposed between the channel structure CH and the cell stack body STc.

Referring to FIG. 2C, the channel structure CH may be connected to the source film SLc via a lower channel structure LPC. The lower channel structure LPC may penetrate the bottom surface of the cell stack body STc and may be in direct contact with the source film SLc. The cell stack body STc may include a first stack body ST1 penetrated by the lower channel structure LPC and a second stack body ST2 penetrated by the channel structure CH. The second stack body ST2 may include the cell interlayer insulating films ILDc and the conductive patterns (for example, CP3 to CPn) disposed on the first stack body ST1. The conductive patterns (for example, CP1 to CP2) of the first stack body ST1 may be used as the source select lines. A boundary between the first stack body ST1 and the second stack body ST2 is not limited to the example shown in FIG. 2C, and may be variously changed.

A gate insulating film GI may be disposed between the lower channel structure LPC and the first stack body ST1.

The lower channel structure LPC may penetrate the gate insulating film GI and may be in contact with the source film SLc. The lower channel structure LPC may be formed of a semiconductor film. For example, the lower channel structure LPC may include an n-type doped silicon film.

The channel semiconductor pattern SE of the channel structure CH may extend along the bottom surface of the channel structure CH to be in direct contact with the lower channel structure LPC. The memory film ML may be penetrated by the channel semiconductor pattern SE and may be disposed between the channel structure CH and the second stack body ST2.

Referring to FIGS. 2A to 2C again, the cell stack body STc may be penetrated by a slit SI. The slits SI may extend to penetrate an upper insulating structure UIL covering the cell stack body STc. The upper insulating structure UIL may extend to cover the dummy stack body STd.

The slit SI may be filled with a source contact structure SCT. The source contact structure SCT may be spaced apart from the cell stack body STc by a sidewall insulating film SWI formed on the sidewall of the slit SI. The sidewall insulation film SWI may be penetrated by the source contact structure SCT. The source contact structure SCT may extend to be in contact with the source film SLa, SLb, or SLc. The source contact structure SCT may include a single conductive material or two or more conductive materials. The conductive material for the source contact structure SCT may include a doped silicon film, a metal film, a metal silicide film, a barrier film, and the like. For example, the source contact structure SCT may include a doped silicon film that is in contact with the source film SLa, SLb, or SLc and a metal film disposed on the doped silicon film.

The upper insulating structure UIL may include a single insulating film or two or more insulating films. For example, the upper insulating structure UIL may include an oxide film. The upper insulating structure UIL may be penetrated by a bit line contact plug BCT. The bit line contact plug BCT may be connected to the doped semiconductor pattern DP of the channel structure CH.

As described above with reference to FIGS. 2A to 2C, the dummy stack body STd may be overlapped with the conductive contact plug DCC penetrating the source film SLa, SLb, or SLc. The embodiments of the present disclosure are not limited thereto and may be modified.

Figure 3:
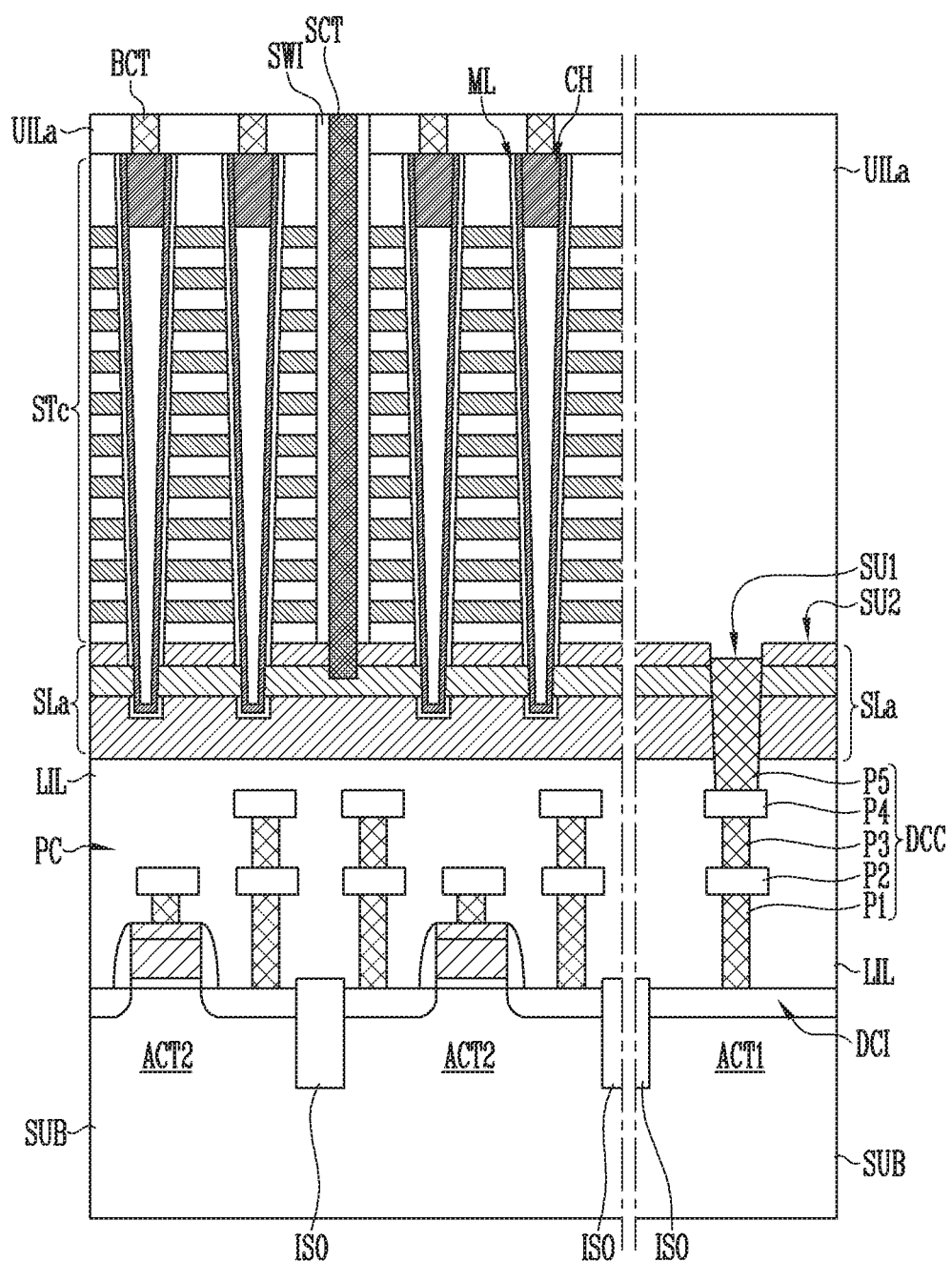
FIG. 3 is a cross-sectional view illustrating a semiconductor memory device according to an embodiment of the present disclosure.

FIG. 3 is a cross-sectional view illustrating a semiconductor memory device according to an embodiment of the present disclosure. Hereinafter, repetitive description of the same components as those shown in FIG. 2A will be omitted. In FIG. 3, the same reference numerals as those in FIG. 2A are added to the same components as those shown in FIG. 2A.

Referring to FIG. 3, the semiconductor memory device may include the substrate SUB including the first active region ACT1 and the second active region ACT2 defined by the isolation layers ISO, the peripheral circuit structure PC disposed on the substrate SUB, the lower insulating structure LIL covering the peripheral circuit structure PC, the source film SLa disposed on the lower insulating structure LIL, the cell stack body Stc disposed on the source film SLa, and the conductive contact plug DCC penetrating a portion of the source film SLa.

The cell stack body STc may be penetrated by the channel structure CH having the side wall surrounded by the memory film ML and the channel structure CH may be connected to the source film SLa. The cell stack body STc may be penetrated by the slit SI filled with the source contact structure SCT and the sidewall insulating film SWI. The cell stack body STc may be covered with an upper insulating structure UILa.

The upper insulating structure UILa may include a single insulating film or two or more insulating films. For example, the upper insulating structure UILa may include an oxide film. The upper insulating structure UILa overlapped with the cell stack body STc may be penetrated by the bit line contact plug BCT connected to the channel structure CH.

A portion of the source film SLa not overlapped by the cell stack body STc may be covered with the upper insulating structure UILa. The upper insulating structure UILa may extend to cover the conductive contact plug DCC.

The conductive contact plug DCC may include the first to fifth patterns P1 to P5 that are sequentially stacked. The conductive contact plug DCC may penetrate the source film SLa and the lower insulating structure LIL and may be in direct contact with the discharge impurity region DCI in the first active region ACT1.

The conductive contact plug DCC may have the first upper surface SU1 facing the upper insulating structure UILa. The source film SLa may have the second upper surface SU2 that is in contact with the upper insulating structure UILa. When the dishing phenomenon occurs in the process of forming the conductive contact plug DCC, the first upper surface SU1 may be formed lower than the second upper surface SU2. The upper insulating structure UILa may fill the depression defined by the height difference between the first upper surface SU1 of the conductive contact plug DCC and the second upper surface SU2 of the source film SLa.

The upper insulating structure UILa shown in FIG. 3 may replace the dummy stack body STd shown in each of FIGS. 2A to 2C.

FIGS. 2A to 2C and 3 illustrate a case where the depression defined by the dishing phenomenon generated in the process of manufacturing the conductive contact plug DCC is filled with the dummy stack body STd configured of an insulating material or the upper insulating structure UILa configured of an insulating material. The embodiments of the present disclosure are not limited thereto. For example, a bottom surface of the dummy stack body STd or the upper insulating structure UILa may be flat. FIGS. 2A to 2C and 3 illustrate a case where the conductive contact plugs DCC include the first to fifth patterns P1 to P5 that are sequentially stacked. The embodiments of the present disclosure are not limited thereto. For example, the conductive contact plug DCC may include a single pattern extending to be in direct contact with the discharge impurity region DCI and the source film SLa, SLb, or SLc. In some embodiments, the cell stack body STc may be laterally spaced apart from the conductive contact plug DCC. In other embodiments, the cell stack body STc does not overlap with the conductive contact plug DCC.

Figure 4A:
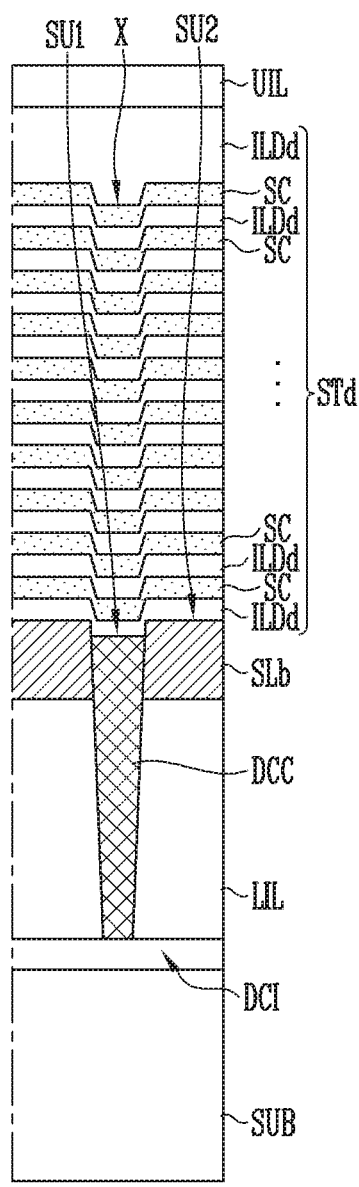
Figure 4B:
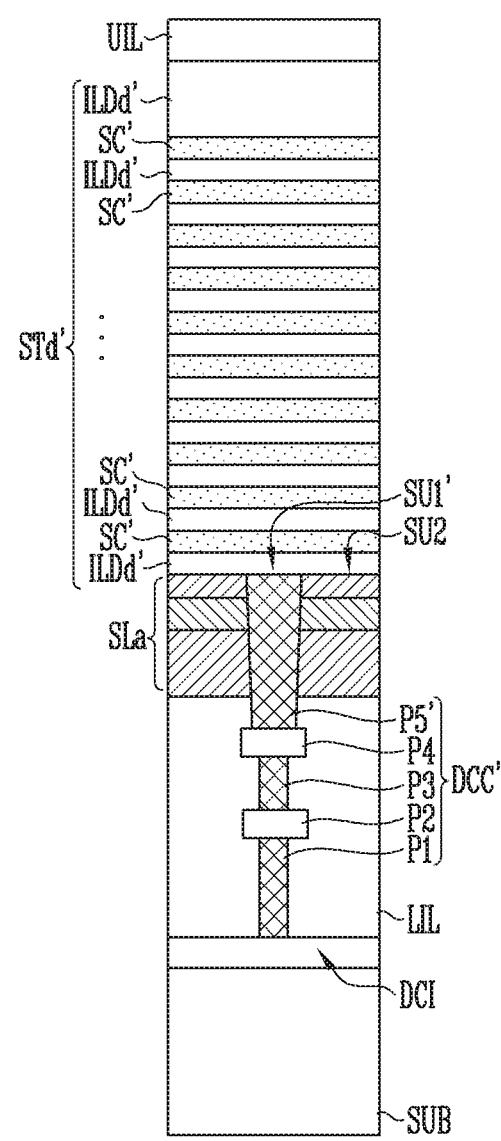

FIGS. 4A to 4C are cross-sectional views illustrating conductive contact plugs according to embodiments of the present disclosure. Hereinafter, repetitive description of the repetitive components will be omitted.

FIG. 4A illustrates an embodiment in which the conductive contact plug include a single pattern.

Referring to FIG. 4A, the conductive contact plug DCC may be a single pattern that is in contact with the discharge impurity region DCI of the substrate SUB and extends to penetrate the lower insulating structure LIL and the source film SLa. The conductive contact plug DCC may be in direct contact with the source film SLa.

The conductive contact plug DCC may be covered with the dummy stack body STc including alternately stacked dummy interlayer insulating films ILDd and sacrificial insulating films SC as described above with reference to FIGS. 2A to 2C. At least one of the dummy interlayer insulating films ILDd and at least one of the sacrificial insulating films SC may include the depression X formed by a step difference defined by the height difference of the first upper surface SU1 of the conductive contact plug DCC and the second upper surface SU2 of the source film SLa as described above with reference to FIGS. 2A to 2C.

The conductive contact plugs DCC shown in FIGS. 2A to 2C may be replaced with the conductive contact plugs DCC shown in FIG. 4A.

FIGS. 4B and 4C are cross-sectional views illustrating embodiments in which an upper surface of the conductive contact plug and an upper surface of the source film are disposed in the same line.

Referring to FIGS. 4B and 4C, a conductive contact plug DCC' that is in contact with the discharge impurity region DCI of the substrate SUB and penetrates the lower insulating structure LIL may penetrate the source film SLa and may be in direct contact with the source film SLa. In a process of forming the conductive contact plug DCC', a first upper surface SU1' of the conductive contact plug DCC' may be disposed at substantially the same level as a second upper surface SU2 of the source film SLa. The conductive contact plug DCC' may include first to fourth patterns P1 to P4 that are sequentially stacked as described above with reference to FIGS. 2A to 2C. The conductive contact plug DCC' may include a fifth pattern P5' disposed on the fourth pattern P4. An upper surface of the fifth pattern P5' may be defined as the first upper surface SU1' of the conductive contact plug DCC' and may be disposed at the same level as the second upper surface SU2.

Referring to FIG. 4B, the first upper surface SU1' of the conductive contact plug DCC' and the second upper surface SU2 of the source film SLa may face a dummy stack body STd'. The dummy stack body STd' may include dummy interlayer insulating films ILDd' and sacrificial insulating films SC' that are alternately stacked on the source film SLa as described above with reference to FIG. 2A. When the first upper surface SU1' and the second upper surface SU2 are disposed at substantially the same level, each of the dummy interlayer insulating films ILDd' and the sacrificial insulating films SC' disposed between the upper insulating structure UIL and the source film SLa may be formed to be substantially flat without including the depression.

The conductive contact plug DCC shown in each of FIGS. 2A to 2C may be replaced with the conductive contact plug DCC' shown in FIG. 4B, and the dummy stack body STd shown in each of FIGS. 2A to 2C may be replaced with the dummy stack body STd' shown in FIG. 4B.

FIG. 4C is a cross-sectional view illustrating a modification example of the conductive contact plug shown in FIG. 3.

Referring to FIG. 4C, the first upper surface SU1' of the conductive contact plug DCC' and the second upper surface SU2 of the source film SLa may be covered with the upper insulating structure UILb. The upper insulating structure UILb may have a flat surface and may extend to cover an upper portion of the cell stack body STc as described above with reference to FIG. 3.

The upper insulating structure UILb shown in FIG. 4C may replace the dummy stack body STd shown in each of FIGS. 2A to 2C.

FIG. 5 is a cross-sectional view illustrating a short circuit between the conductive contact plug and the cell stack body.

Referring to FIG. 5, the cell stack body STc' may be overlapped a conductive contact plug DCCa that is in contact with the discharge impurity region DCI of the substrate SUB. The conductive contact plug DCCa may include the first to fifth patterns P1 to P5, or may be a single pattern as described above with reference to FIG. 4A.

A dishing phenomenon may occur in a process of forming the conductive contact plug DCCa penetrating the source film SL. At least one of cell interlayer insulating films ILDc' and conductive patterns CP1' to CPn' configuring the cell stack body STc' may include a depression Y by the dishing phenomenon. At this time, an insulation distance in Z regions may be reduced. For example, a distance between the lowermost conductive pattern CP1' and the conductive contact plug DCCa may be close. In this case, the conductive contact plug DCCa and the lowermost conductive pattern CP1' may be short-circuited.

According to the embodiments shown in FIGS. 2A to 2C, 3, and 4A to 4C, the conductive contact plug penetrating the source film may be covered with the insulating material without being overlapped by the cell stack body. Therefore, according to the embodiments shown in FIGS. 2A to 2C, 3, and 4A to 4C, even though the dishing phenomenon occurs in the process of forming the conductive contact plug, a short circuit between the cell stack body and the conductive contact plug may be prevented.

Figure 6:
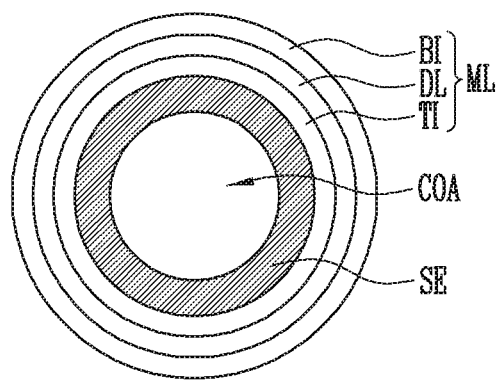
FIG. 6 is a cross-sectional view illustrating a channel semiconductor pattern.

FIG. 6 is a cross-sectional view illustrating a channel semiconductor pattern. The channel semiconductor pattern shown in FIG. 6 may be included in the channel structure CH shown in each of FIGS. 2A to 2C and 3.

Referring to FIG. 6, the channel semiconductor pattern SE may be formed in an annular shape defining a core region COA. The core region COA may be filled with the doped semiconductor pattern DP shown in each of FIGS. 2A to 2C, or may be filled with the core insulating film CO shown in each of FIGS. 2A to 2C.

The memory film ML surrounding the channel semiconductor pattern SE may include a tunnel insulating film TI, a data storage film DL, and a blocking insulating film BI, which are sequentially stacked on a surface of the channel semiconductor pattern SE. The data storage film DL may be formed of a material film capable of storing data that is changed using fowler-nordheim tunneling. To this end, the data storage film DL may be formed of various materials, for example, a nitride film capable of charge trapping. The embodiments of the present disclosure are not limited thereto, and the data storage film DL may include silicon, phase change material, nano dot, and the like. The blocking insulating film BI may include an oxide film capable of charge blocking. The tunnel insulating film TI may be formed of a silicon oxide film capable of charge tunneling.

Figure 7:
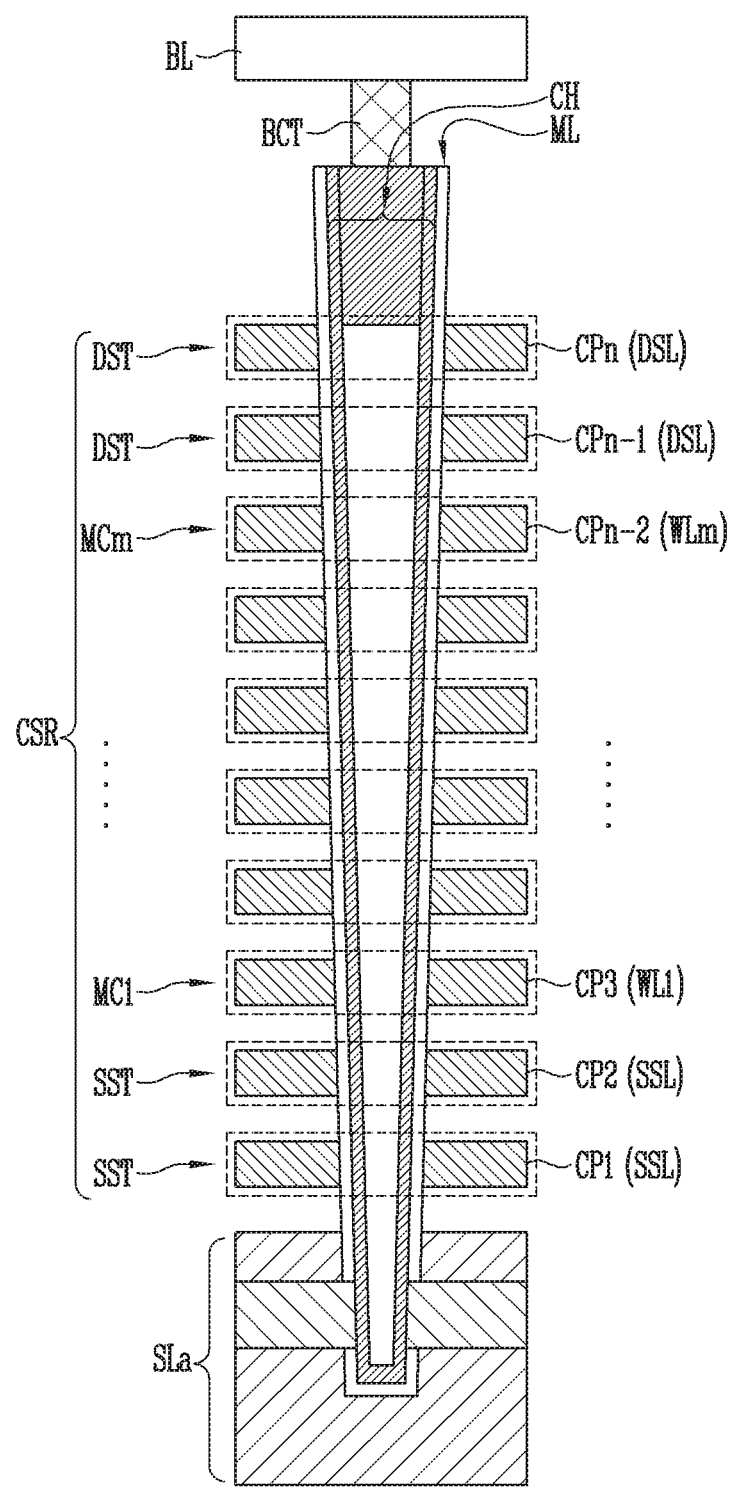
FIG. 7 is a cross-sectional view illustrating a three-dimensional cell string structure according to an embodiment of the present disclosure.

FIG. 7 is a cross-sectional view illustrating a three-dimensional cell string structure according to an embodiment of the present disclosure. For example, FIG. 7 illustrates a three dimensional cell string structure that may be implemented using the cell stack body and the channel structure shown in FIG. 2A.

Referring to FIG. 7, the cell string CSR may include at least one source select transistor SST, the memory cells MC1 to MCm, and at least one drain select transistor DST which are stacked along an extension direction of the channel structure CH surrounded by the memory film ML. The memory cells MC1 to MCm may be connected in series between the source select transistor SST and the drain select transistor DST by the channel structure CH. The source select transistor SST may be connected in series between the first memory cell MC1 and the source film SLa by the channel structure CH. The drain select transistor DST may be connected in series between the m-th memory cell MCm and the bit line BL by the channel structure CH. The bit line BL may be connected to the channel structure CH by a bit line contact plug BCT corresponding to the bit line BL. The embodiments of the present disclosure are not limited thereto. For example, the bit line BL may be in direct contact with the channel structure CH corresponding to the bit line BL.

The source select transistor SST may be defined at an intersection portion of the channel structure CH and a conductive pattern used as the source select line SSL, the drain select transistor DST may be defined at an intersection portion of the channel structure CH and a conductive pattern used as the drain select line DSL, and the memory cells MC1 to MCm may be defined at an intersection portions of the channel structure CH and conductive patterns used as the word lines WL1 to WLm.

The first conductive pattern CP1 adjacent to the source film SLa among the conductive patterns CP1 to CPn may be used as the source select line SSL. The n-th conductive pattern CPn disposed farthest from the source film SLa among the conductive patterns CP1 to CPn may be used as the drain select line DSL. The embodiments of the present disclosure are not limited thereto. For example, one or more conductive patterns adjacent to and sequentially stacked on the first conductive pattern CP1 among the second to (n−1)-th conductive pattern CP2 to CPn−1 may be used as different source select lines SSL. In addition, one or more conductive patterns adjacent to and sequentially stacked on the n-th conductive pattern CPn among the second to the (n−1)-th conductive pattern CP2 to CPn−1 may be used as different drain select lines DSL. The conductive patterns (for example, CP2 to CPn−2) disposed between the neighboring drain select line DSL and source select line SSL may be used as the word lines WL1 to WLm.

The cell string structure CSR described above may be implemented using the cell stack body and channel structure shown in each of FIGS. 2B, 2C, and 3.

Figure 8A:
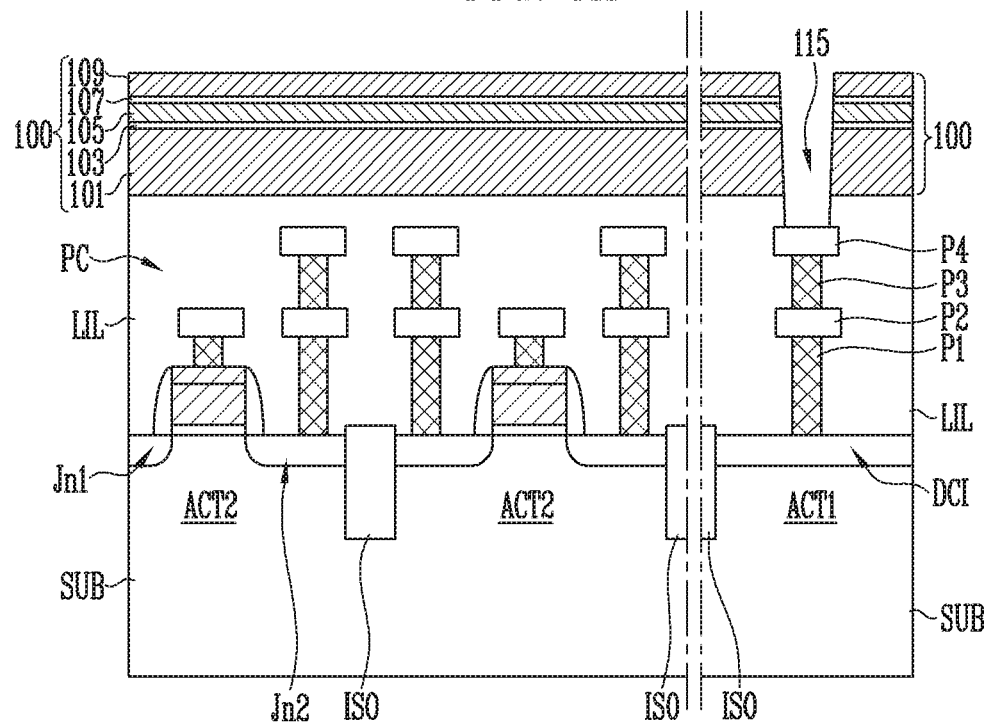
FIGS. 8A to 8B are cross-sectional views illustrating a method of manufacturing a semiconductor memory device according to an embodiment of the present disclosure.
Figure 8B:
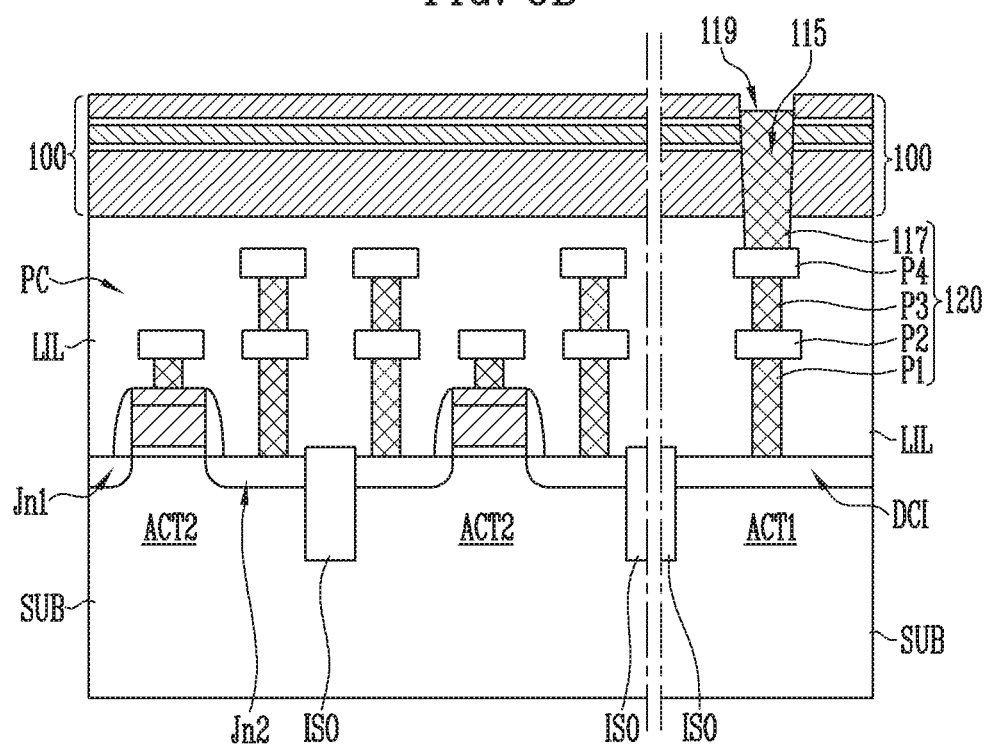

FIGS. 8A to 8B are cross-sectional views illustrating a method of manufacturing a semiconductor memory device according to an embodiment of the present disclosure.

Referring to FIG. 8A, the peripheral circuit structure PC and the first to fourth patterns P1 to P4 may be formed on the substrate SUB including the active regions ACT1 and ACT2 partitioned by the isolation layers ISO. The peripheral circuit structure PC and the first to fourth patterns P1 to P4 may be covered with the lower insulation structure LIL.

The active regions ACT1 and ACT2 may include the first active region ACT1 and the second active region ACT2. The first active region ACT1 may include the discharge impurity region DCI and the second active region ACT2 may include the junctions Jn1 and Jn2.

Because the isolation layers ISO, the active regions ACT1 and ACT2, the discharge impurity regions DCI, the junctions Jn1 and Jn2, the peripheral circuit structure PC, and the lower insulating structure LIL are described with reference to FIGS. 2A to 2C, repetitive description thereof is omitted.

The first to fourth patterns P1 to P4 may be formed of a conductive material and may be sequentially stacked on the discharge impurity region DCI. The first pattern P1 disposed in the lowermost layer among the first to fourth patterns P1 to P4 may be in direct contact with the discharge impurity region DCI.

Subsequently, a lower stack body 100 may be formed on the lower insulation structure LIL. The lower stack body 100 may include a lower semiconductor film 101, a sacrificial film 105, and an upper semiconductor film 109 which are sequentially stacked. A first protective film 103 may be formed on the lower semiconductor film 101 before the sacrificial film 105 is deposited on the lower semiconductor film 101. A second protective film 107 may be formed on the lower semiconductor film 101 or the first protective film 103 before the upper semiconductor film 109 is formed on the lower semiconductor film 101 or the first protective film 103.

The lower semiconductor film 101 may include a doped semiconductor film including a conductive impurity. For example, the lower semiconductor film 101 may include an n-type doped silicon film. The sacrificial film 105 may include a material having an etching rate different from that of the first protective film 103 and the second protective film 107. Each of the first protective film 103 and the second protective film 107 may include a material having an etching rate different from those of the lower semiconductor film 101 and the upper semiconductor film 109. For example, the sacrificial film 105 may include an un-doped silicon film, and each of the first protective film 103 and the second protective film 107 may include an oxide film. The upper semiconductor film 109 may include a semiconductor film. For example, the upper semiconductor film 109 may include a doped silicon film or an un-doped silicon film.

Subsequently, an opening portion 115 penetrating a portion of the lower stack body 100 overlapped with the discharge impurity region DCI and extending into the lower insulation structure LIL may be formed. The opening portion 115 may expose the fourth pattern P4 disposed on the uppermost layer among the first to fourth patterns P1 to P4.

Referring to FIG. 8B, a conductive film may be formed on the lower stack body 100 so that the opening portion 115 is filled. Thereafter, a planarization process may be performed so that the lower stack body 100 is exposed. Therefore, a fifth pattern 117 may be formed. The fifth pattern 117 may fill the inside of the opening portion 115 and be in direct contact with the fourth pattern P4. The first to fourth patterns P1 to P4 and the fifth pattern 117 may configure a conductive contact plug 120 connected to the discharge impurity region DCI.

The planarization process may include a chemical mechanical polishing (CMP) process. The planarization process may be performed so that the conductive film outside the opening portion 115 is removed.

While the planarization process is performed, a dishing phenomenon may occur. At this time, the conductive contact plug 120 may remain lower than the opening portion 115, and an upper end of the opening portion 115 may be exposed by the conductive contact plug 120. Therefore, a groove 119 may be defined by a height difference between the lower stack body 100 and the conductive contact plug 120.

Figure 8C:
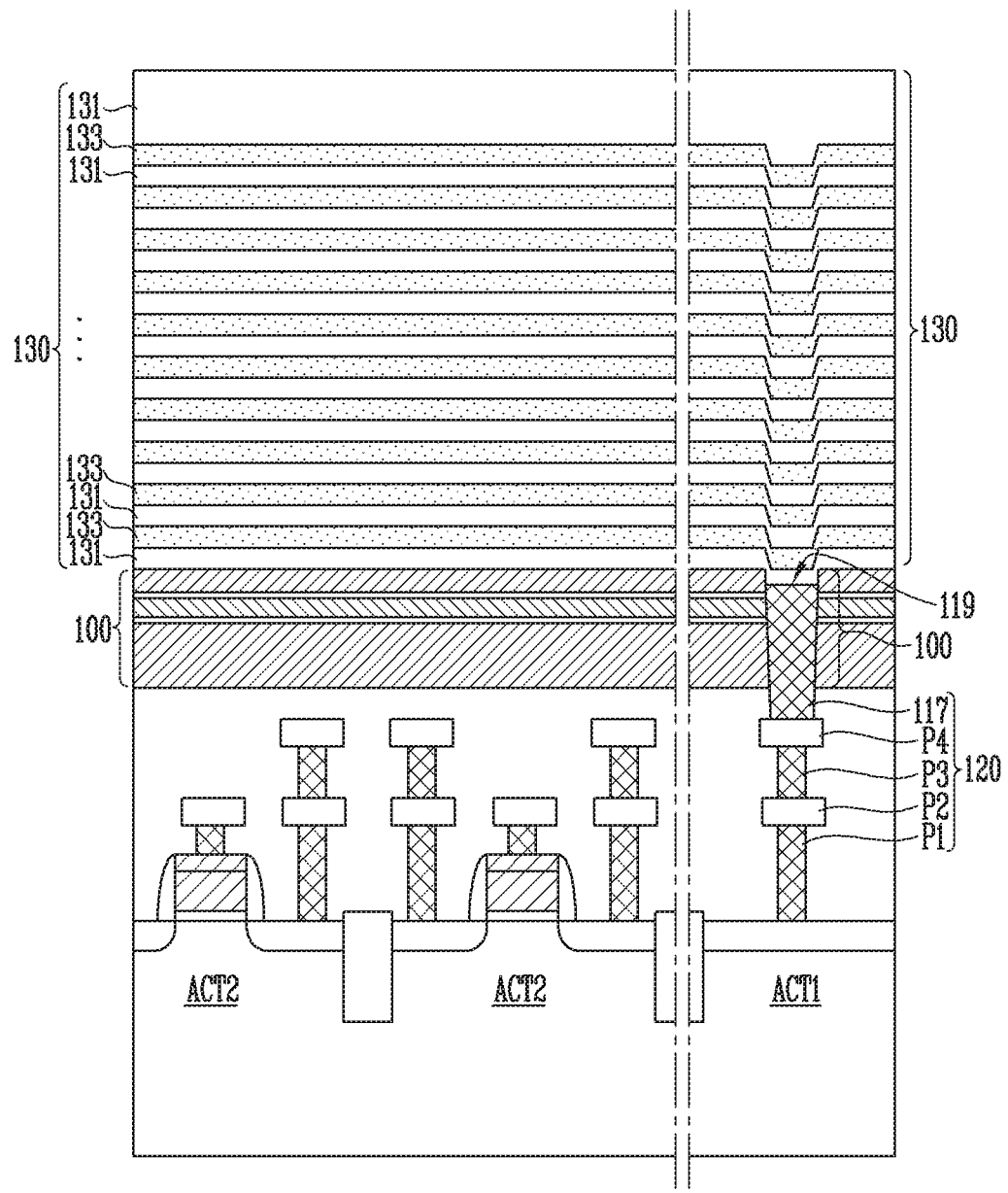

Referring to FIG. 8C, an upper stack body 130 may be formed on the lower stack body 100. The upper stack body 130 may include first material films 131 and second material films 133 which are alternately stacked. The first material films 131 and the second material films 133 extend so as to overlap the conductive contact plug 120. At least one of the first material films 131 and at least one of the second material films 133 may include a concave portion overlapping the groove 119. The embodiments of the present disclosure are not limited thereto. For example, when a depth of the groove 119 defined by the dishing phenomenon is shallow and no dishing phenomenon occurs, surfaces of the films overlapped with the conductive contact plug DCC' (for example, ILDd' and SC') may be flat as shown in FIG. 4B.

The first material films 131 may include a material different from that of the second material films 133. As an embodiment, the first material films 131 may include an insulating material, and the second material films 133 may include a sacrificial insulating material having an etching rate different from that of the first material films 131. For example, each of the first material films 131 may include silicon oxide, and each of the second material films 133 may include silicon nitride.

Figure 8D:
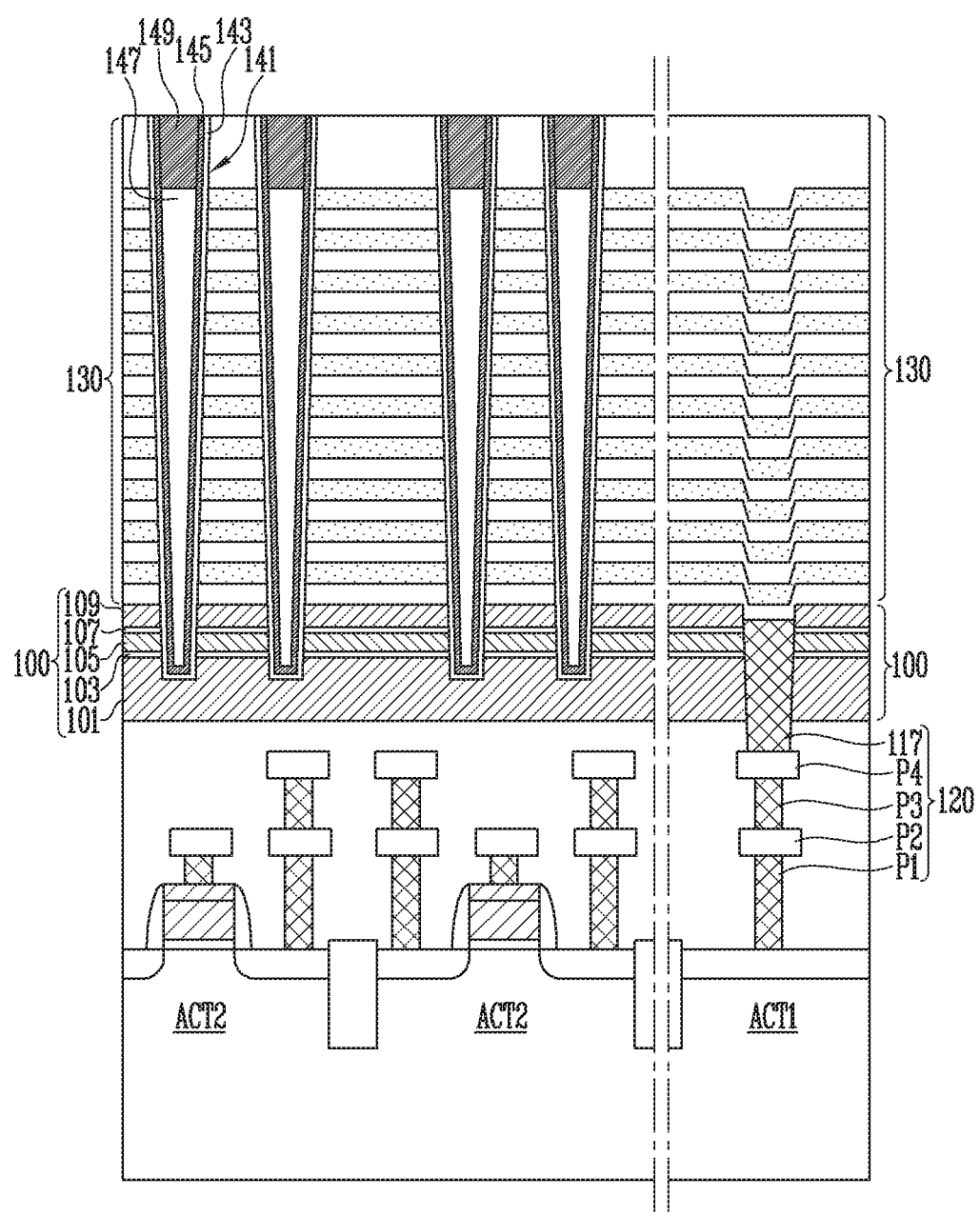

Referring to FIG. 8D, a channel hole 141 penetrating the upper stack body 130 and extending into the lower stack body 100 may be formed. The channel hole 141 may be disposed so as not to overlap the conductive contact plug 120. For example, the channel hole 141 may be disposed to be laterally spaced apart from the conductive contact plug 120. The channel hole 141 may penetrate the upper stack body 130 and penetrate the upper semiconductor film 109, the second protective film 107, the sacrificial film 105, and the first protective film 103 of the lower stack body 100. The channel hole 141 may extend into the lower semiconductor film 101.

Subsequently, a memory film 143 may be formed on a surface of the channel hole 141 in a conformal manner. The memory film 143 may include the tunnel insulating film TI, the data storage film DL, and the blocking insulating film BI shown in FIG. 6.

A channel semiconductor pattern 145 may be formed in a center region of the channel hole 141 opened by the memory film 143. The channel semiconductor pattern 145 may be formed in a column shape filling the center region of the channel hole 141 opened by the memory film 143. Alternatively, the channel semiconductor pattern 145 may be formed along the surface of the memory film 143 in a conformal manner and the center region of the channel hole 141 may be opened by the channel semiconductor pattern 145. The center region of the channel hole 141 opened by the channel semiconductor pattern 145 may be filled with a core insulating film 147. The core insulating film 147 may be formed at a height lower than that of the channel semiconductor pattern 145 and the channel hole 141. In this case, a doped semiconductor pattern 149 may be formed on the core insulating film 147. The doped semiconductor pattern 149 may be surrounded by an upper end of the channel semiconductor pattern 145 extending longer than the core insulating layer 147.

The channel semiconductor pattern 145 may include a silicon film. The doped semiconductor pattern 149 may include an n-type doped silicon film. The core insulating film 147 may include an oxide.

Figure 8E:
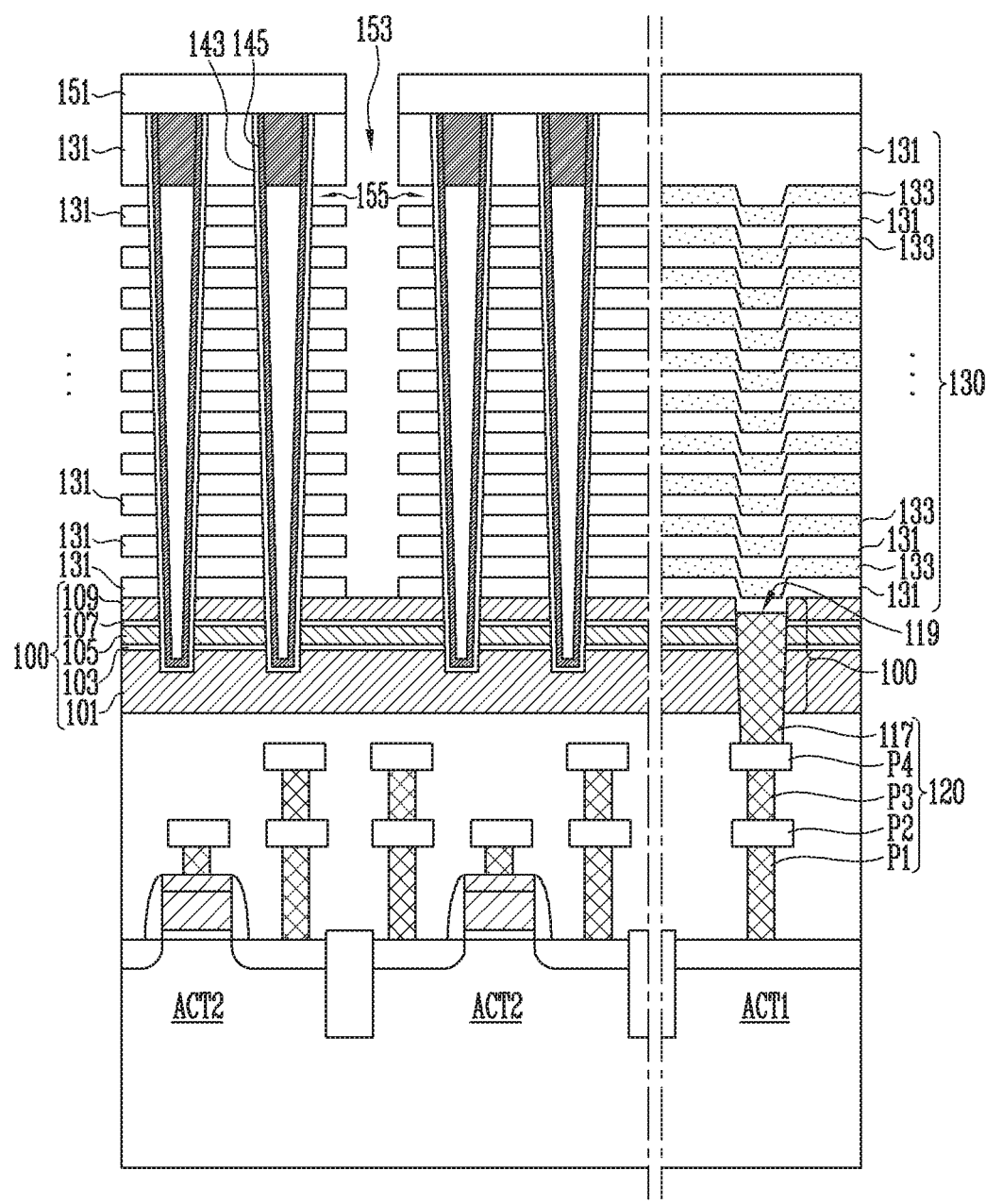

Referring to FIG. 8E, an upper insulating structure 151 may be formed on the upper stack body 130. The upper insulating structure 151 may extend to cover the channel semiconductor pattern 145 surrounded by the memory film 143. The upper insulating structure 151 may include at least one insulating film.

Subsequently, a slit 153 penetrating the upper insulating structure 151 and the upper stack body 130 may be formed. The slit 153 may be disposed so as not to overlap the conductive contact plug 120. The slit 153 may be disposed adjacent to the channel semiconductor pattern 145.

During an etching process for forming the slit 153, the upper semiconductor film 109 of the lower stack body 100 may serve as an etch stop film.

Subsequently, a portion of each of the second material films 133 surrounding the channel semiconductor pattern 145 may be removed through the slit 153. Therefore, interlayer spaces 155 may be defined in a region where the second material films 133 are removed. The interlayer spaces 155 may be defined between the first material films 131 adjacent to each other in a vertical direction.

The etching process for removing a portion of each of the second material films 133 may be controlled so that another portion of each of the second material films 133 overlapped with the conductive contact plug 120 may remain. At this time, the remaining second material films 133 may configure the sacrificial insulating films SC shown in FIG. 2A.

Figure 8F:
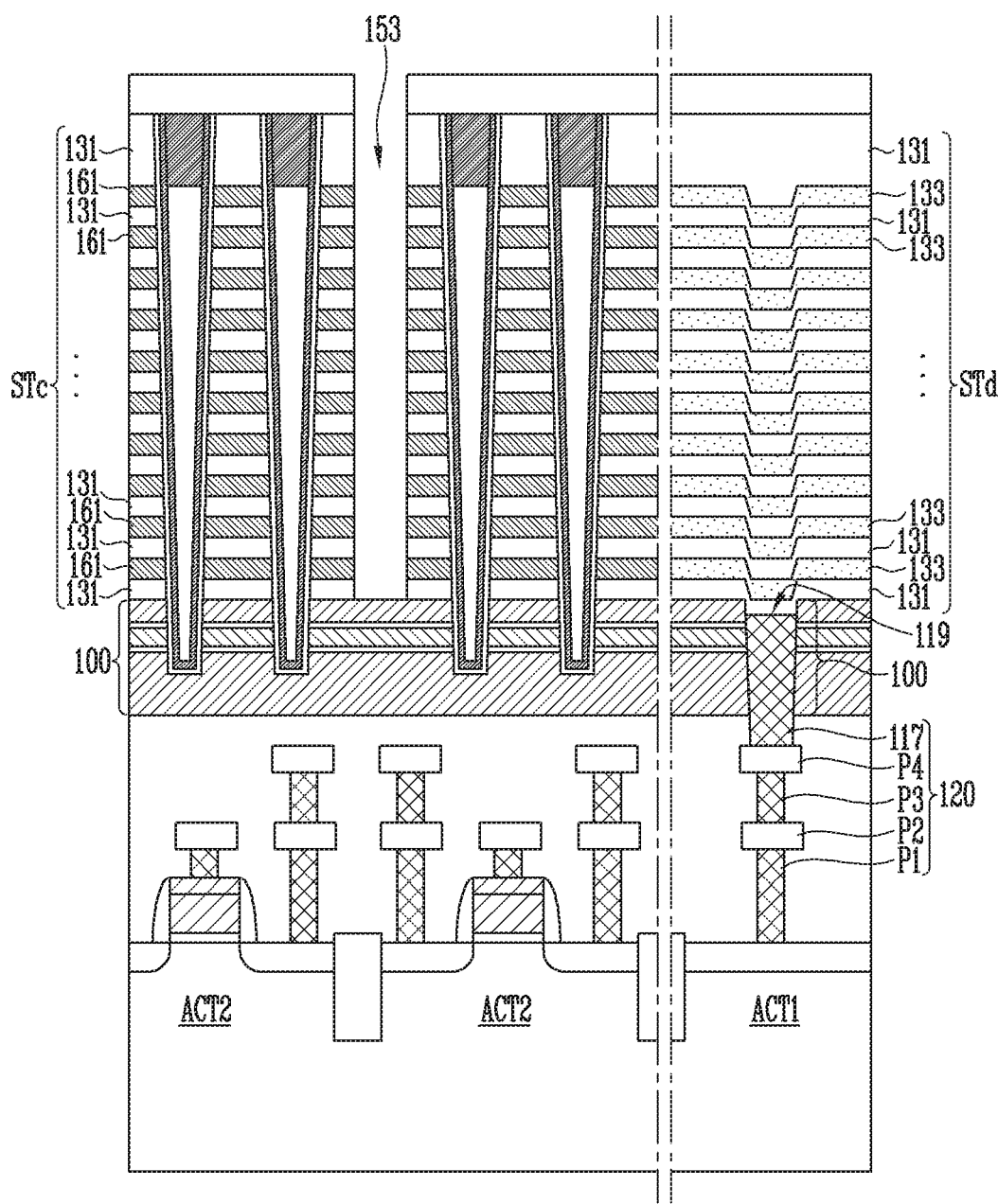

Subsequently, the interlayer spaces 155 may be filled with a conductive patterns 161 as shown in FIG. 8F.

Referring to FIG. 8F, forming the conductive patterns 161 may include introducing a conductive material into the interlayer spaces 155 shown in FIG. 8D through the slit 153, and removing the conductive material inside the slit 153 so that the conductive material is divided into the conductive pattern 161. Therefore, the cell stack body STc including the first material films 131 and the conductive patterns 161 which are alternately stacked on the lower stack body 100 may be formed.

Each of the conductive patterns 161 may include at least one of a doped silicon film, a metal silicide film, and a metal film. Each of the conductive patterns 161 may further include a barrier film such as a titanium nitride film, a tungsten nitride film, and a tantalum nitride film.

The first material films 131 and the second material films 133 which are stacked on the conductive contact plug 120 remain as the dummy stack body STd, are formed of an insulating material, and may prevent the introduction of the conductive material. Therefore, even though the groove 119 is defined by the height difference between the conductive contact plug 120 and the lower stack body 100, an insulating distance between the conductive contact plug 120 and the conductive patterns 161 may be increased by the dummy stack body STd including the first material films 131 and the second material films 133.

Figure 8G:
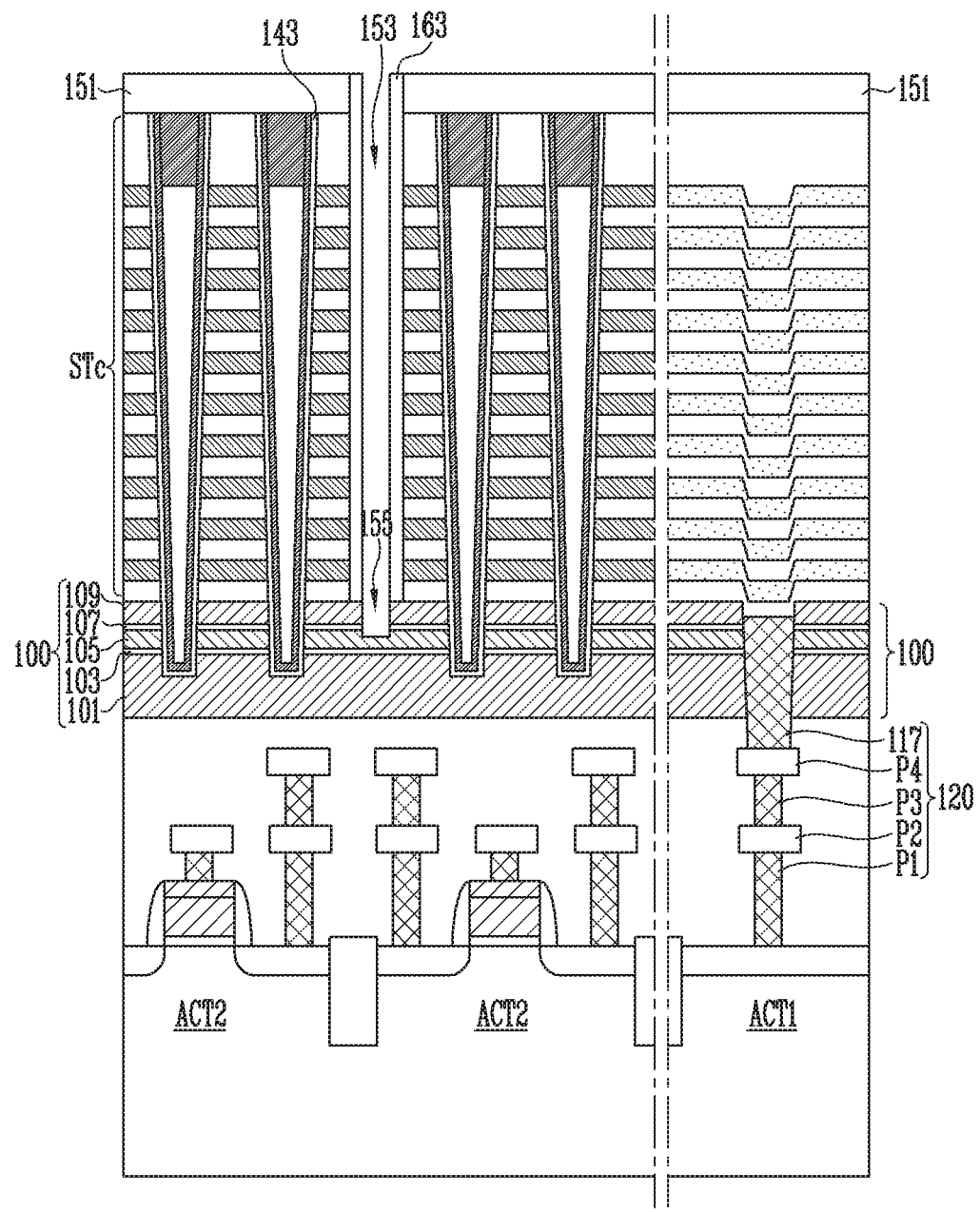

Referring to FIG. 8G, a sidewall insulation film 163 may be formed on a sidewall of the slit 153. The sidewall insulating film 163 may be etched so as to expose a bottom surface of the slit 153. The lower stack body 100 may be exposed through the bottom surface of the slit 153 exposed by the sidewall insulating film 163.

Subsequently, a slit extension portion 155 may be formed. The slit extension portion 155 may penetrate the upper semiconductor film 109 and the second protective film 107 of the lower stack body 100 and expose the sacrificial film 105 of the lower stack body 100.

Thereafter, the sacrificial film 105 is removed through the slit extension portion 155, and a portion of the memory film 143 may be removed through the region where the sacrificial film 105 is removed. The first protective film 103 and the second protective film 107 may prevent a loss of the upper semiconductor film 109 and the lower semiconductor film 101 while the sacrificial film 105 is removed. The first protective film 103 and the second protective film 107 may be removed while the memory film 143 is removed.

Figure 8H:
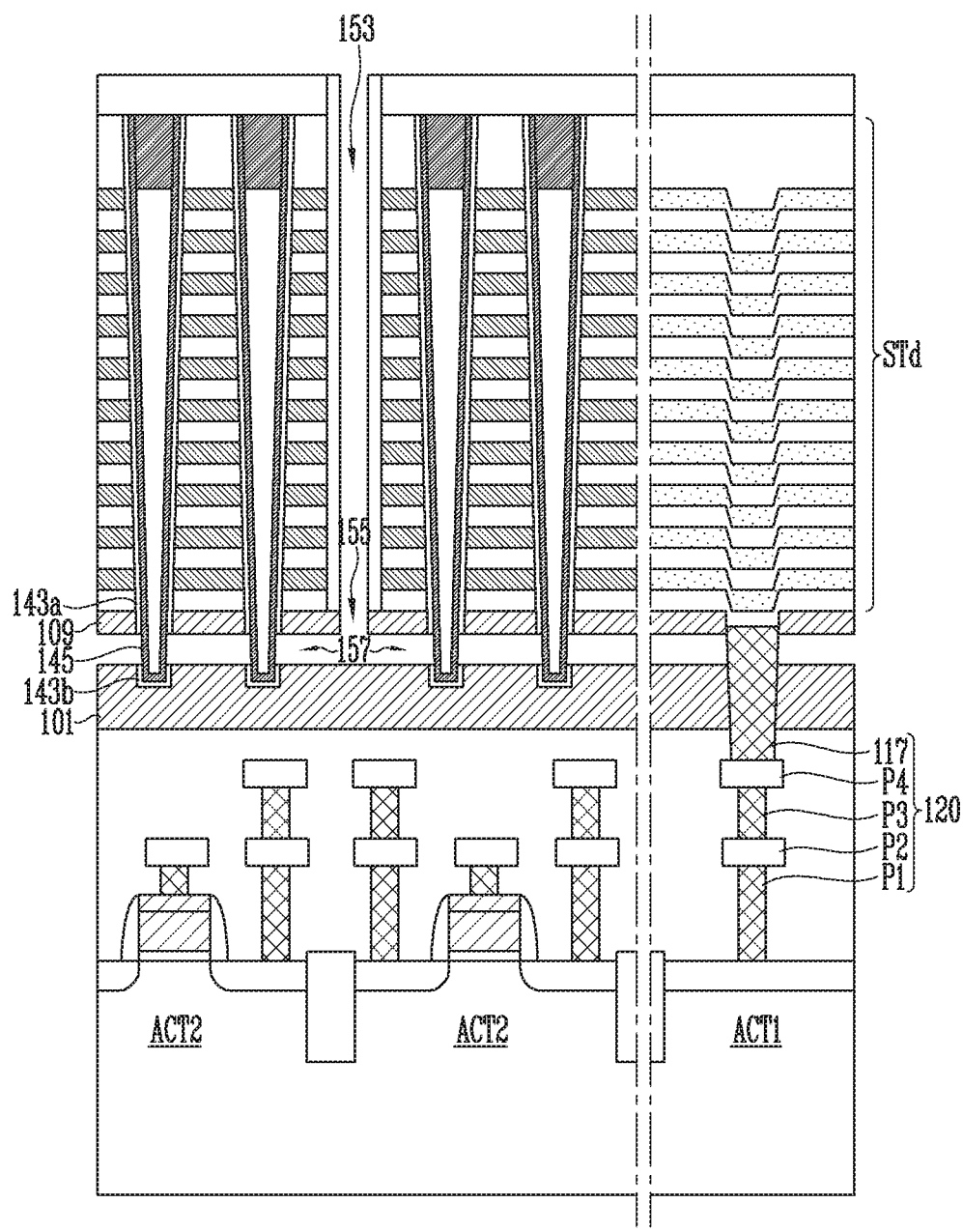

Referring to FIG. 8H, a horizontal space 157 may be opened between the upper semiconductor film 109 and the lower semiconductor film 101 as the sacrificial film, a portion of the memory film, the first protective film, and the second protective film are removed. The horizontal space 157 may divide the memory film into a first memory pattern 143a and a second memory pattern 143b. The horizontal space 157 may expose a portion of the side wall of the channel semiconductor pattern 145. The horizontal space 157 may extend so as to be overlapped with the dummy stack body STd. The horizontal space 157 may extend to expose a portion of the side wall of the conductive contact plug 120. For example, the horizontal space 157 may expose the sidewall of the fifth pattern 117.

Figure 8I:
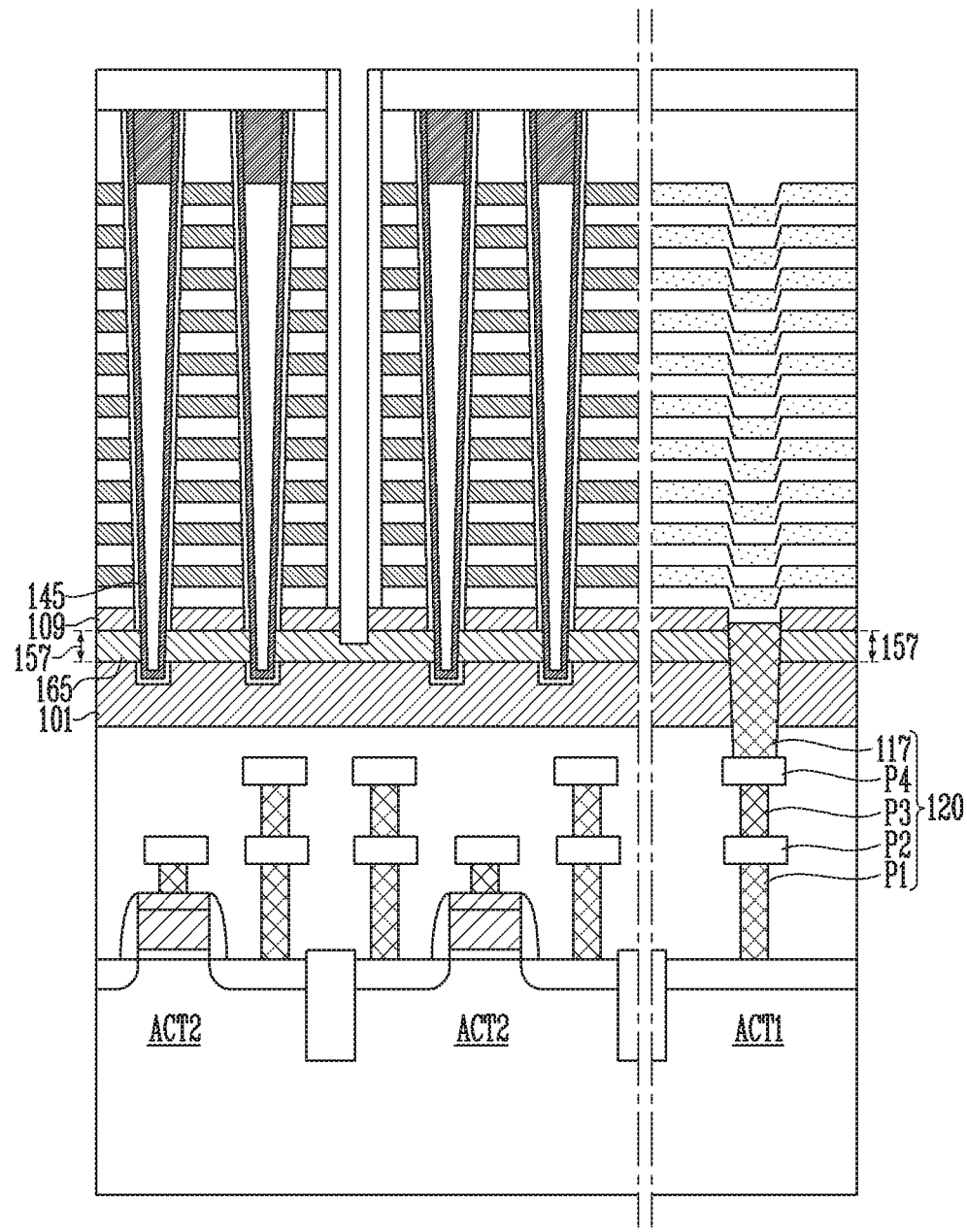
Figure 8J:
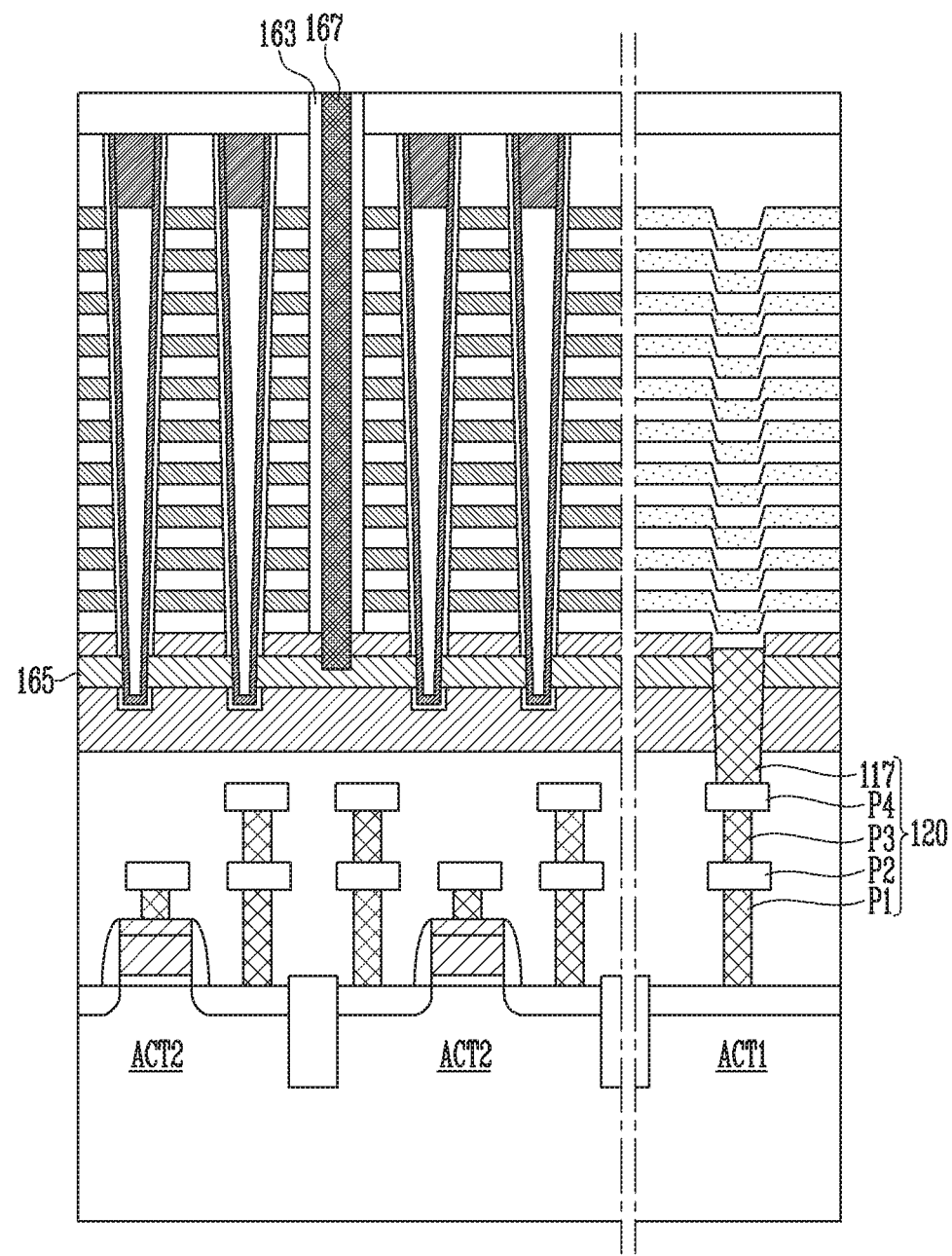

Referring to FIG. 8I, the horizontal space 157 may be filled with a source semiconductor film 165. The source semiconductor film 165 may be in contact with each of the sidewall of the channel semiconductor film 145, the lower semiconductor film 101, and the upper semiconductor film 109. The source semiconductor film 165 may be formed using a chemical vapor deposition method or may be formed using a growth method using each of the channel semiconductor film 145, the lower semiconductor film 101, and the upper semiconductor film 109 as a seed layer. The source semiconductor film 165 may be in direct contact with the conductive contact plug 120. For example, the source semiconductor film 165 may be in direct contact with the fifth pattern 117. The source semiconductor film 165 may include a conductive dopant. For example, the source semiconductor film 165 may include an n-type doped silicon film. The conductive dopant in the source semiconductor film 165 may be diffused into the upper semiconductor film 109 and the channel semiconductor film 145 which are in contact with the source semiconductor film 165 by heat.

Referring to FIG. 8B, a source contact structure 167 may be formed that is in contact with the source semiconductor film 165 and extends over the sidewall insulating film 163. The source contact structure 167 is formed of a conductive material.

Thereafter, a subsequent process for forming the bit line contact plug BCT shown in FIG. 2A and the bit line BL shown in FIG. 7 may be performed.

The semiconductor memory device shown in FIGS. 2A, 4A, and 4B may be formed using the process shown in FIGS. 8A to 8J. Some of the processes shown in FIGS. 8A to 8B may be applied to manufacture the semiconductor memory devices shown in FIGS. 2B and 2C.

Figure 9A:
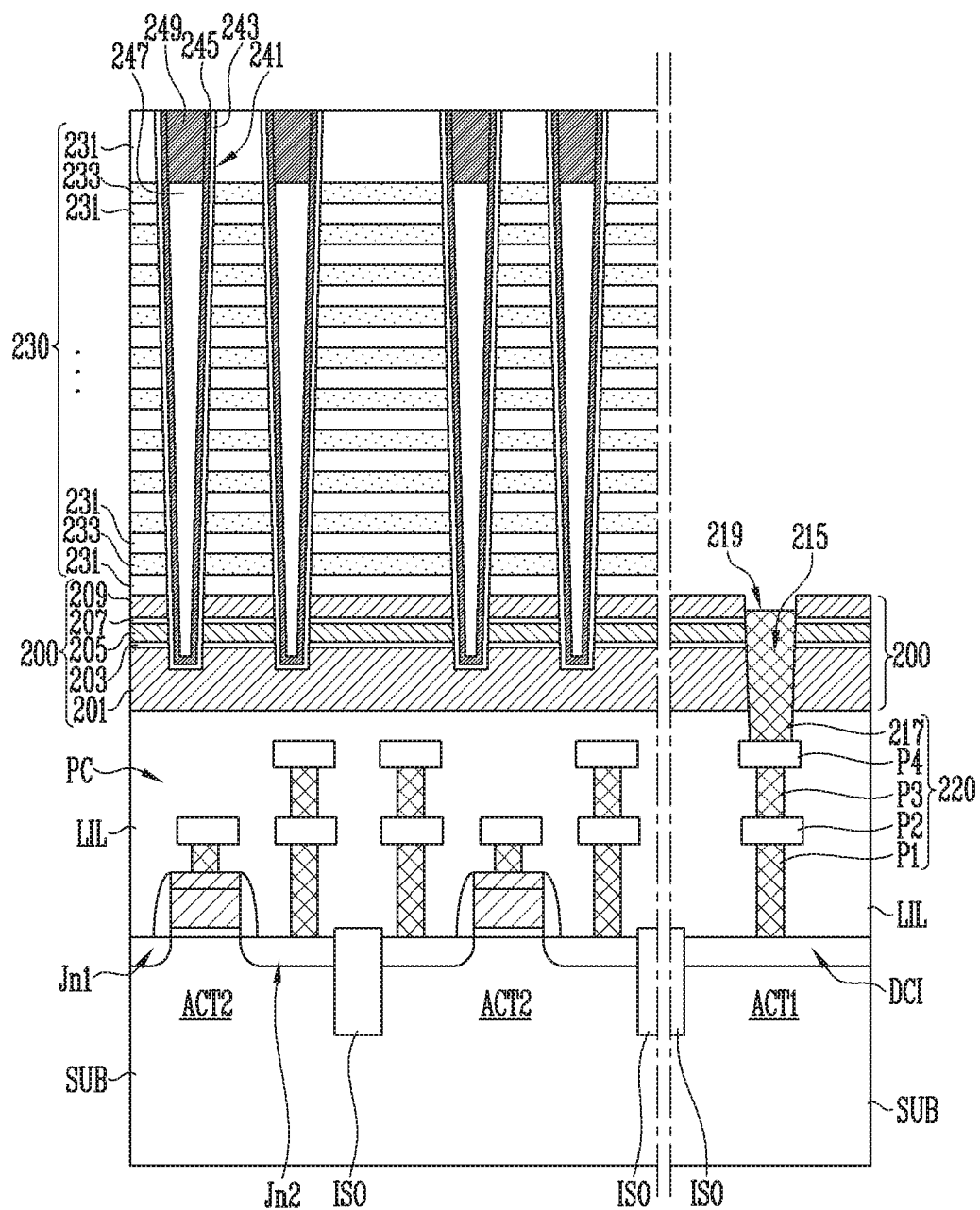
FIGS. 9A to 9C are cross-sectional views illustrating a method of manufacturing a semiconductor memory device according to an embodiment of the present disclosure.
Figure 9B:
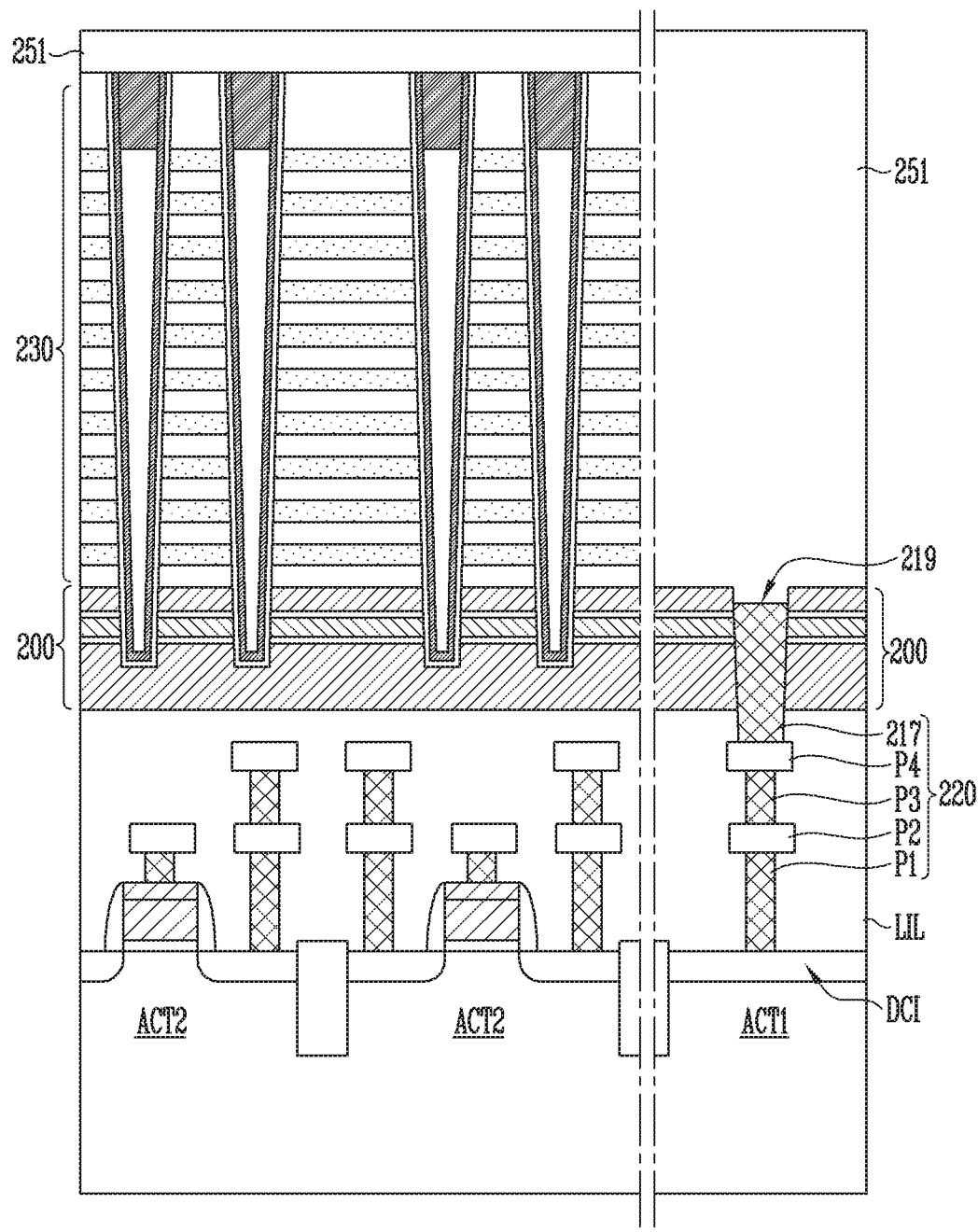
Figure 9C:
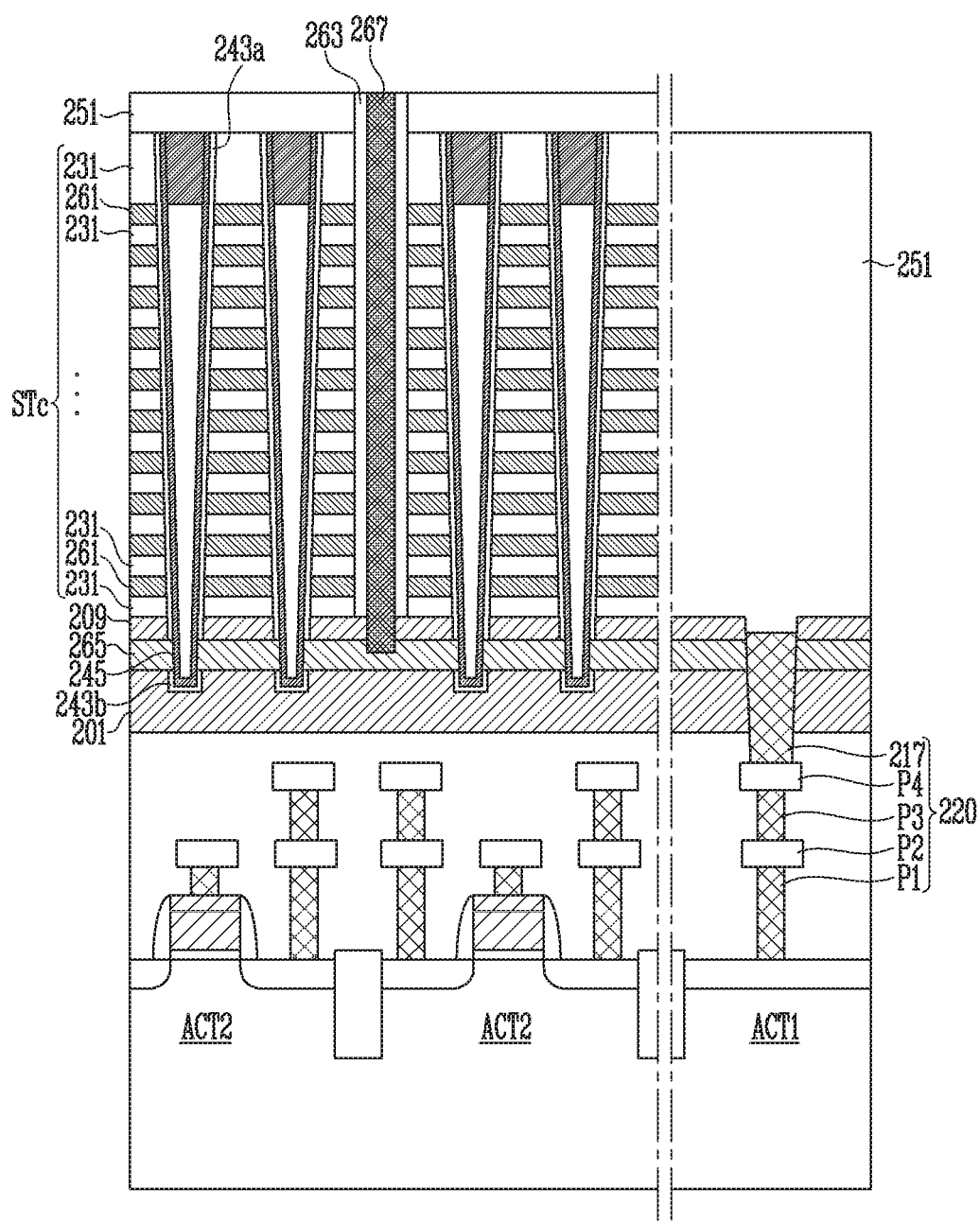

FIGS. 9A to 9C are cross-sectional views illustrating a method of manufacturing a semiconductor memory device according to an embodiment of the present disclosure.

Referring to FIG. 9A, as described above with reference to FIG. 8A, the peripheral circuit structure PC and the first to fourth patterns P1 to P4 that are disposed on the substrate SUB including the active regions ACT1 and ACT2 partitioned by the isolation layers ISO and covered with the lower insulating structure LIL may be formed.

The active areas ACT1 and ACT2 may include the first active region ACT1 and the second active region ACT2, as described above with reference to FIGS. 2A to 2C. The first active region ACT1 may include the discharge impurity region DCI and the second active region ACT2 may include the junctions Jn1 and Jn2.

Subsequently, a lower stack body 200 may be formed on the lower insulation structure LIL equally to that described above with reference to FIG. 8A. The lower stack body 200 may include a lower semiconductor film 201, a first protective film 203, a sacrificial film 205, a second protective film 207, and an upper semiconductor film 209 equally to that described above reference to FIG. 8A.

Thereafter, using the above-described processes with reference to FIGS. 8A and 8B, a fifth pattern 217 may be formed. The fifth pattern 217 may penetrate a portion of the lower stack body 200 overlapped with the discharge impurity region DCI and extend into the lower insulating structure LIL to be in direct contact with the fourth pattern P4. Therefore, a conductive contact plug 220 connected to the discharge impurity region DCI may be formed.

A step difference may be formed between a surface of the lower stack body 200 and a surface of the conductive contact plug 220 by a dishing phenomenon generated in a process of forming the conductive contact plug 220. Therefore, a groove 219 may be defined. The embodiments of the present disclosure are not limited thereto. For example, when no dishing phenomenon occurs, the groove 219 might not be defined, as shown in FIG. 4C.

Subsequently, an upper stack body 230 including first material films 231 and second material films 233 that are alternately stacked on the lower stack body 200 may be formed equally to that described above with reference to FIG. 8C. Thereafter, a channel hole 241, a memory film 243, a channel semiconductor pattern 245, a core insulating film 247, and a doped semiconductor pattern 249 may be formed using the same processes as those described above with reference to FIG. 8D.

In addition, a portion of the upper stack body 230 overlapped the discharge impurity region DCI and the conductive contact plug 220 may be removed. Therefore, the conductive contact plug 220 and the groove 219 may be exposed.

Referring to FIG. 9B, an upper insulating structure 251 may be formed on the upper stack body 230. The upper insulating structure 251 may extend so as to overlap the discharge impurity region DCI and the conductive contact plug 220. The upper insulating structure 251 may be formed so as to fill the groove 219. A surface of the upper insulating structure 251 may be flat. The upper insulating structure 151 may include at least one insulating film. For example, the upper insulating structure 151 may include an oxide film.

Referring to FIG. 9C, the second material films may be replaced with conductive patterns 261 by performing the same processes as those described above with reference to FIGS. 8E and 8F. Thereafter, a sidewall insulating film 263 may be formed equally to that described above with reference to FIG. 8G. Subsequently, the sacrificial film, the first protective film, and the second protective film may be replaced with the source semiconductor film 265 by performing the same processes as those described above with reference to FIGS. 8G to 8I. The source semiconductor film 265 may divide the memory film into a first memory pattern 243a and a second memory pattern 243b and may be in contact with each of a side wall of the channel semiconductor film 245, the lower semiconductor film 201, and the upper semiconductor film 209.

Thereafter, as described above with reference to FIG. 83, after forming a source contact structure 267, a subsequent process for forming the bit line contact plug BCT shown in FIG. 2A and the bit line BL shown in FIG. 7 may be performed.

The semiconductor memory device shown in FIG. 3 or 4C may be formed by using the process shown in FIGS. 9A to 9C.

Figure 10:
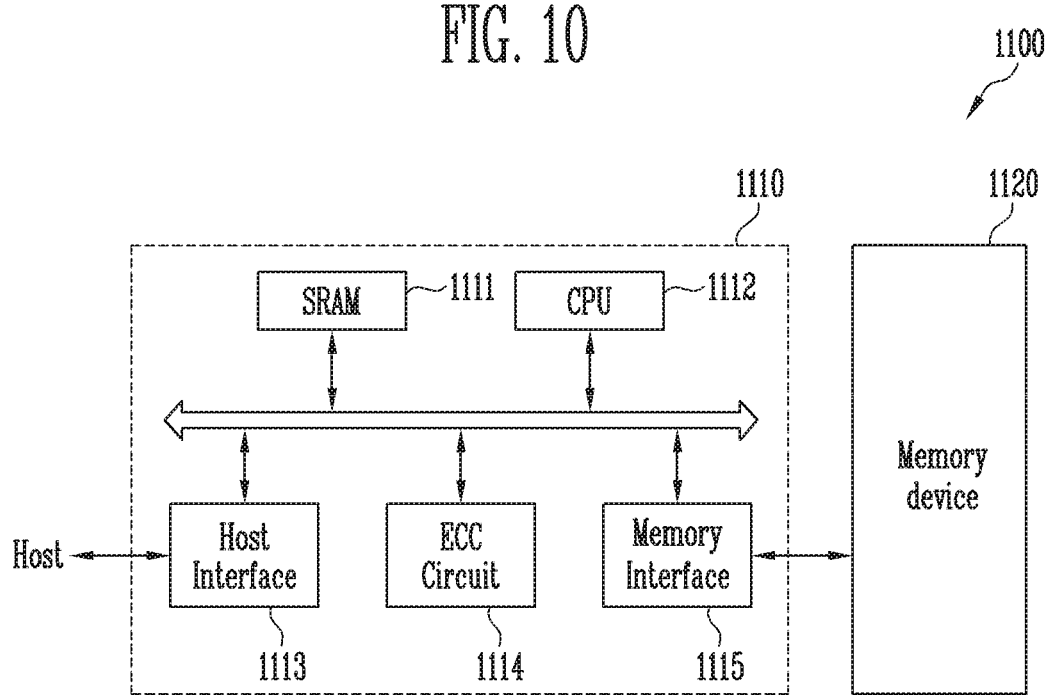
FIG. 10 is a block diagram illustrating a configuration of a memory system according to an embodiment of the present disclosure.

FIG. 10 is a block diagram illustrating a configuration of a memory system according to an embodiment of the present disclosure.

Referring to FIG. 10, the memory system 1100 according to an embodiment of the present disclosure includes a memory device 1120 and a memory controller 1110.

The memory device 1120 may be a multi-chip package configured of a plurality of flash memory chips. The memory device 1120 may include the conductive contact plugs shown in FIGS. 2A to 2C, 3, and 4A to 4C, and at least one insulating film overlapped with the conductive contact plug. The memory device 1120 may include the semiconductor memory devices according to the embodiments of the present disclosure mentioned above with reference to the various figures discussed herein.

The memory controller 1110 is configured to control the memory device 1120 and may include a static random access memory (SRAM) 1111, a CPU 1112, a host interface 1113, an error correction code (ECC) circuit 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the ECC circuit 1114 detects and corrects an error included in data read from the memory device 1120 and the memory interface 1115 performs interfacing with the memory device 1120. In addition, the memory controller 1110 may further include a read only memory (ROM) that stores code data for interfacing with the host.

The memory system 1100 described above may be a memory card or a solid state drive (SSD) with which the memory device 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 11:
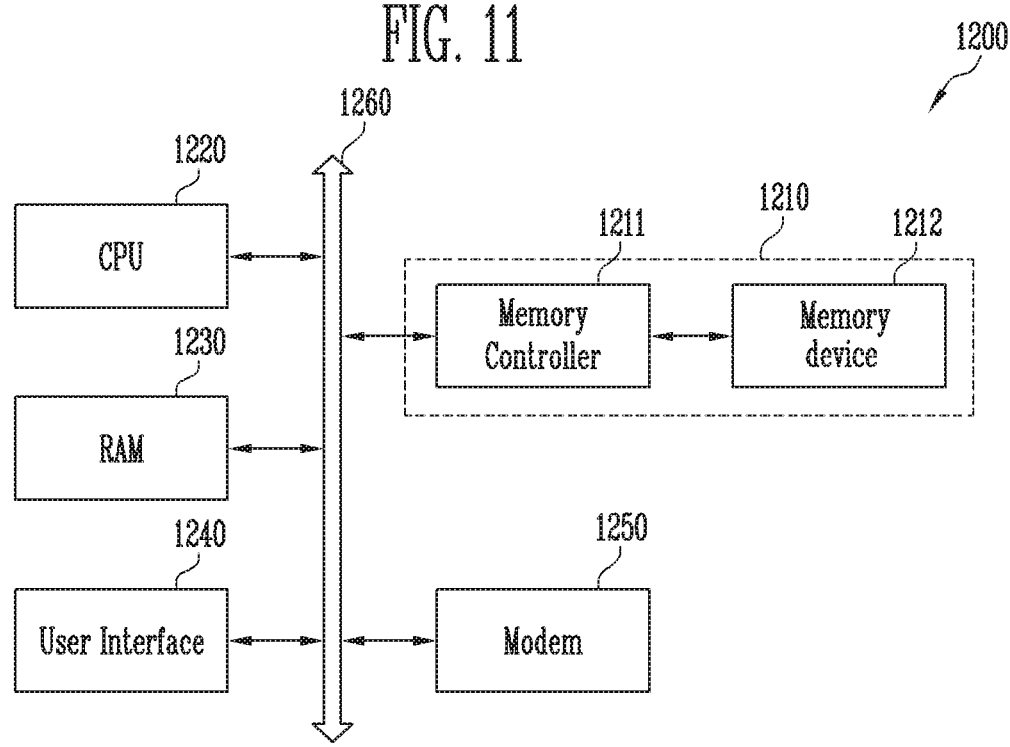
FIG. 11 is a block diagram illustrating a configuration of a computing system according to an embodiment of the present disclosure.

FIG. 11 is a block diagram illustrating a configuration of a computing system according to an embodiment of the present disclosure.

Referring to FIG. 11, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of a memory device 1212 and a memory controller 1211. The memory device 1212 may include the semiconductor memory devices according to the embodiments of the present disclosure mentioned above with reference to the various figures discussed herein.

According to embodiments of the present technology, the insulating material is disposed on the conductive contact plug penetrating the source film and the cell stack body is disposed so as not to be overlapped with the conductive contact plug. Therefore, an insulation distance between the cell stack body and the conductive contact plug that penetrates the source film may be increased. Thus, according to embodiments of the present technology, short circuit between the conductive contact plug and the conductive pattern of the cell stack body may be enhanced and operation reliability of the semiconductor memory device may be improved.

What is claimed is:
1. A semiconductor memory device comprising:
   a source film spaced from a substrate and disposed on the substrate;
   a conductive contact plug penetrating the source film; and
   a dummy stack body including dummy interlayer insulating films and sacrificial insulating films alternately stacked on the conductive contact plug,
   wherein an upper surface of the conductive contact plug facing the dummy stack body is formed lower than an upper surface of the source film facing the dummy stack body.
2. The semiconductor memory device of claim 1, wherein the conductive contact plug is in contact with the substrate.
3. The semiconductor memory device of claim 1, further comprising:
   isolation layers disposed in the substrate to divide active regions of the substrate;
   a discharge impurity region defined in a first active region overlapped with the conductive contact plug of the active regions and contacting the conductive contact plug; and
   a lower insulating structure disposed between the substrate and the source film and penetrated by the conductive contact plug.
4. The semiconductor memory device of claim 1, further comprising:
   a cell stack body including cell interlayer insulating films and conductive patterns alternately stacked on the source film; and
   a channel structure penetrating the cell stack body and electrically connected to the source film.
5. The semiconductor memory device of claim 4, wherein the cell stack body is laterally spaced apart from the conductive contact plug.
6. The semiconductor memory device of claim 4, wherein a bottom surface of the channel structure is in direct contact with the source film.
7. The semiconductor memory device of claim 4, wherein the channel structure extends into the source film and the channel structure has a side wall that is in direct contact with the source film.
8. The semiconductor memory device of claim 4, further comprising:
   a lower channel structure disposed between the channel structure and the source film.
9. The semiconductor memory device of claim 4, further comprising:
   isolation layers disposed in the substrate to divide active regions of the substrate;
   a peripheral circuit structure including a transistor disposed on a second active region overlapped with the cell stack body of the active regions; and
   a lower insulating structure covering the peripheral circuit structure between the substrate and the source film and penetrated by the conductive contact plug.
10. The semiconductor memory device of claim 1, wherein at least one of the dummy interlayer insulating films and at least one of the sacrificial insulating films include a depression overlapped with the upper surface of the conductive contact plug.
11. A semiconductor memory device comprising:
   a source film spaced from a substrate and disposed on the substrate;
   a conductive contact plug penetrating the source film to contact with the substrate;

a cell stack body including cell interlayer insulating films and conductive patterns alternately stacked on the source film, and laterally spaced apart from the conductive contact plug; and an upper insulating structure covering the conductive contact plug and the cell stack body, wherein an upper surface of the conductive contact plug facing the upper insulating structure is formed lower than an upper surface of the source film facing the upper insulating structure.

12. The semiconductor memory device of claim 11, further comprising:

channel structures penetrating the cell stack body and connected to the source film.

13. The semiconductor memory device of claim 12, wherein a bottom surface of the channel structure is in direct contact with the source film.

14. The semiconductor memory device of claim 12, wherein the channel structure extends into the source film and the channel structure has a side wall that is in direct contact with the source film.

15. The semiconductor memory device of claim 12, further comprising:

a lower channel structure disposed between the channel structure and the source film.

16. The semiconductor memory device of claim 11, further comprising:

isolation layers disposed in the substrate to divide active regions of the substrate;

a discharge impurity region defined in a first active region overlapped with the conductive contact plug of the active regions and contacting the conductive contact plug; and a lower insulating structure disposed between the substrate and the source film and penetrated by the conductive contact plug.

17. The semiconductor memory device of claim 11, further comprising:

isolation layers disposed in the substrate to divide active regions of the substrate;

a peripheral circuit structure including a transistor disposed on a second active region overlapped with the cell stack body of the active regions; and a lower insulating structure covering the peripheral circuit structure between the substrate and the source film and penetrated by the conductive contact plug.

* * * * *